(12) United States Patent
Li

(10) Patent No.: US 10,978,640 B2
(45) Date of Patent: *Apr. 13, 2021

(54) MANUFACTURING OF CARBON NANOTUBE THIN FILM TRANSISTOR BACKPLANES AND DISPLAY INTEGRATION THEREOF

(71) Applicant: Atom H2O, LLC, Escondido, CA (US)

(72) Inventor: Huaping Li, Los Angeles, CA (US)

(73) Assignee: Atom H2O, LLC, Escondido, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/678,491

(22) Filed: Nov. 8, 2019

(65) Prior Publication Data
US 2020/0127201 A1    Apr. 23, 2020

Related U.S. Application Data

(63) Continuation-in-part of application No. 15/589,896, filed on May 8, 2017, now Pat. No. 10,665,796.
(Continued)

(51) Int. Cl.
*H01L 51/00* (2006.01)
*H01L 51/05* (2006.01)
(Continued)

(52) U.S. Cl.
CPC ........ *H01L 51/0003* (2013.01); *H01L 27/283* (2013.01); *H01L 27/3274* (2013.01);
(Continued)

(58) Field of Classification Search
CPC ............. H01L 51/0003; H01L 51/0018; H01L 27/283; H01L 51/0048
See application file for complete search history.

(56) References Cited

U.S. PATENT DOCUMENTS

| 5,180,690 A | 1/1993 | Czubatyj et al. |
| 6,682,863 B2 | 1/2004 | Rivers et al. |

(Continued)

FOREIGN PATENT DOCUMENTS

| CN | 108885967 A | 11/2018 |
| CN | 110892532 A | 3/2020 |

(Continued)

OTHER PUBLICATIONS

Powell, "The Physics of Amorphous-Silicon Thin-Film Transistors", IEEE Transactions on Electron Devices, Dec. 1989, vol. 36, No. 12, pp. 2753-2763.

(Continued)

*Primary Examiner* — Anthony Ho
(74) *Attorney, Agent, or Firm* — KPPB LLP

(57) ABSTRACT

Methods for producing and integrating single-walled carbon nanotubes (SWCNT) into existing TFT backplane manufacturing lines are provided. In contrast to LTPS and oxide TFT backplanes, SWCNT TFT backplanes exhibit either equivalent or better figures of merit such as high field emission mobility, low temperature fabrication, good stability, uniformity, scalability, flexibility, transparency, mechanical deformability, low voltage and low power, bendability and low cost. Methods and processes for integrating SWCNTs technologies into existing TFT backplane manufacturing lines, pilot test and mass production can start without additional capex needs are also provided.

20 Claims, 27 Drawing Sheets

Related U.S. Application Data

(60) Provisional application No. 62/758,376, filed on Nov. 9, 2018.

(51) Int. Cl.
*H01L 27/28* (2006.01)
*H01L 27/32* (2006.01)

(52) U.S. Cl.
CPC ...... *H01L 51/0018* (2013.01); *H01L 51/0048* (2013.01); *H01L 51/0545* (2013.01); *H01L 2227/323* (2013.01)

(56) References Cited

U.S. PATENT DOCUMENTS

| | | | |
|---|---|---|---|
| 6,919,681 B2 | 7/2005 | Cok et al. | |
| 7,064,372 B2 | 6/2006 | Duan et al. | |
| 7,253,041 B2 | 8/2007 | Gan et al. | |
| 7,537,975 B2 | 5/2009 | Moon et al. | |
| 7,907,226 B2 | 3/2011 | Yang et al. | |
| 7,932,511 B2 | 4/2011 | Duan et al. | |
| 8,232,561 B2 | 7/2012 | Rinzler et al. | |
| 8,246,928 B1 | 8/2012 | Rao et al. | |
| 8,512,668 B2 | 8/2013 | Tanaka et al. | |
| 8,715,607 B2 | 5/2014 | Liu et al. | |
| 8,940,562 B1 | 1/2015 | Li | |
| 9,070,775 B2 | 6/2015 | Chaji et al. | |
| 9,445,421 B2 | 9/2016 | Levine et al. | |
| 9,455,421 B2 | 9/2016 | Li | |
| 9,487,002 B2 | 11/2016 | Rogers et al. | |
| 9,748,439 B2 | 8/2017 | Li et al. | |
| 10,418,595 B2 | 9/2019 | Li | |
| 10,497,888 B2 | 12/2019 | Kleemann et al. | |
| 10,541,374 B2 | 1/2020 | Li | |
| 10,665,796 B2 | 5/2020 | Li | |
| 2004/0252113 A1 | 12/2004 | Vicentini et al. | |
| 2005/0221016 A1 | 10/2005 | Glatkowski et al. | |
| 2006/0063460 A1 | 3/2006 | Seo | |
| 2006/0081844 A1 | 4/2006 | Hirosue et al. | |
| 2006/0110862 A1 | 5/2006 | Gan et al. | |
| 2006/0145144 A1 | 7/2006 | Lee et al. | |
| 2006/0261433 A1 | 11/2006 | Manohara et al. | |
| 2007/0026646 A1 | 2/2007 | Chae | |
| 2007/0246784 A1 | 10/2007 | Kang et al. | |
| 2008/0008643 A1 | 1/2008 | Landi et al. | |
| 2008/0023066 A1 | 1/2008 | Hecht et al. | |
| 2008/0143906 A1 | 6/2008 | Allemand et al. | |
| 2008/0217588 A1 | 9/2008 | Arnold et al. | |
| 2008/0286447 A1 | 11/2008 | Alden et al. | |
| 2009/0008634 A1* | 1/2009 | Tessler | B82Y 10/00 257/40 |
| 2010/0103089 A1* | 4/2010 | Yoshida | G09G 3/3611 345/102 |
| 2010/0145062 A1 | 6/2010 | Li et al. | |
| 2011/0012125 A1 | 1/2011 | Nicholas et al. | |
| 2011/0036403 A1 | 2/2011 | Yoon et al. | |
| 2011/0045660 A1 | 2/2011 | Romano et al. | |
| 2011/0223095 A1 | 9/2011 | Harvey et al. | |
| 2011/0285951 A1 | 11/2011 | Yoon et al. | |
| 2012/0062109 A1 | 3/2012 | Berry et al. | |
| 2012/0104328 A1 | 5/2012 | Park et al. | |
| 2012/0256175 A1 | 10/2012 | Rinzler et al. | |
| 2012/0280213 A1 | 11/2012 | Gau et al. | |
| 2013/0069043 A1 | 3/2013 | Friend et al. | |
| 2013/0105770 A1 | 5/2013 | Pschenitzka | |
| 2013/0108793 A1 | 5/2013 | Sivarajan et al. | |
| 2014/0209997 A1 | 7/2014 | Qian et al. | |
| 2014/0217409 A1 | 8/2014 | Chaji et al. | |
| 2014/0273379 A1 | 9/2014 | Tsai et al. | |
| 2015/0102288 A1 | 4/2015 | Hersam et al. | |
| 2015/0155430 A1 | 6/2015 | Li | |
| 2015/0202662 A1 | 7/2015 | Li | |
| 2015/0279919 A1 | 10/2015 | Zhou et al. | |
| 2015/0340631 A1 | 11/2015 | Rinzler et al. | |
| 2016/0043152 A1* | 2/2016 | Tian | H01L 29/78684 257/27 |
| 2016/0126293 A1* | 5/2016 | Li | H01L 33/32 257/29 |
| 2016/0137854 A1 | 5/2016 | Heintz et al. | |
| 2016/0190170 A1 | 6/2016 | Yamazaki et al. | |
| 2016/0280547 A1 | 9/2016 | Liu et al. | |
| 2016/0359144 A1 | 12/2016 | Li | |
| 2016/0380217 A1 | 12/2016 | Afzali-Ardakani et al. | |
| 2017/0194581 A1 | 7/2017 | Li | |
| 2017/0213963 A1* | 7/2017 | Cain | H01L 51/0048 |
| 2018/0148337 A1 | 5/2018 | Walsh et al. | |
| 2018/0323387 A1 | 11/2018 | Li | |
| 2018/0323388 A1 | 11/2018 | Li | |
| 2018/0323406 A1 | 11/2018 | Li | |
| 2018/0358568 A1 | 12/2018 | Luan et al. | |
| 2019/0081259 A1 | 3/2019 | Mao | |
| 2020/0067025 A1 | 2/2020 | Li | |
| 2020/0203644 A1 | 6/2020 | Li | |

FOREIGN PATENT DOCUMENTS

| | | |
|---|---|---|
| CN | 111149232 A | 5/2020 |
| GB | 2562921 A | 11/2018 |
| HK | 40000981 A | 2/2020 |
| KR | 10-2020-0005583 A | 1/2020 |
| KR | 10-2020-0024771 A | 3/2020 |
| TW | 201734155 A | 10/2017 |
| WO | 2014208896 A1 | 12/2014 |
| WO | 2015077629 A1 | 5/2015 |
| WO | 2017096058 A1 | 6/2017 |
| WO | 2017120214 A1 | 7/2017 |
| WO | 2018204870 A1 | 11/2018 |
| WO | 2018208284 A1 | 11/2018 |

OTHER PUBLICATIONS

Rossi, "Two Decades of Research on Nano-Energetic Materials", Propellants Explos. Pyrotech., Jun. 11, 2014, vol. 39, pp. 323-327. DOI: 10.1002/prep.201480151.

Rouhi et al., "Fundamental limits on the mobility of nanotube-based semiconducting inks", Advanced Materials, 2011, Published Online Oct. 26, 2010, vol. 23, pp. 94-99, doi: 10.1002/adma.201003281.

Rouhi et al., "High performance semiconducting nanotube inks: progress and prospects", ACS Nano, Oct. 4, 2011, vol. 5, No. 11, 8471-8487, doi: 10.1021/nn201828y.

Rutherglen et al., "Nanotube electronics for radiofrequency applications", Nature Nanotechnology, Dec. 2009, vol. 4, pp. 811-819, published online Nov. 29, 2009.

Sabourin et al., "Functionalized Graphene Sheet Colloids for Enhanced Fuel/ Propellant Combustion", ACS Nano, Nov. 19, 2009, vol. 3, No. 12, pp. 3945-3954, doi: 10.1021/nn901006w.

Schoppler et al., "Molar extinction coefficient of single-wall carbon nanotubes", Journal of Physical Chemistry C, Jun. 22, 2011, vol. 115, pp. 14682-14686, doi: 10.1021/jp205289h.

Seo et al., "Diameter Refinement of Semiconducting Arc Discharge Single-Walled Carbon Nanotubes via Density Gradient Ultracentrifugation", Journal of Physical Chemistry Letters, Aug. 7, 2013, vol. 4, No. 17, pp. 2805-2810, doi: 10.1021/jz4013596.

Seo et al., "Improved High-Efficiency Organic Solar Cells via Incorporation of a Conjugated Polyelectrolyte Interlayer", Journal of the American Chemical Society, May 10, 2011, vol. 133, pp. 8416-8419, doi: /10.1021/ja2037673.

Seo et al., "Improved Injection in n-Type Organic Transistors with Conjugated Polyelectrolytes", Journal of the American Chemical Society, Oct. 4, 2009, vol. 131, pp. 18220-18221.

Seo et al., "Solution-Processed Organic Light-Emitting Transistors Incorporating Conjugated Polyelectrolytes", Advanced Functional Materials, Jul. 18, 2011, vol. 21, pp. 3667-3672, doi: 10.1002/adfm.201100682.

Shao et al., "Long-lifetime polymer light-emitting electrochemical cells", Advanced Materials, 2007, vol. 19, pp. 365-370.

Shastry et al., "Large-Area, Electronically Monodisperse, Aligned Single-Walled Carbon Nanotube Thin Films Fabricated by Evaporation-

(56) References Cited

OTHER PUBLICATIONS

Driven Self-Assembly", Small, Sep. 17, 2012, vol. 9, No. 1, pp. 45-51, doi: 10.1002/smll.201201398.
Shulaker et al., "Carbon nanotube computer", Nature, Sep. 26, 2013, vol. 501, pp. 526-530, doi: 10.1038/nature12502.
Sirringhaus et al., "Integrated Optoelectronic Devices Based on Conjugated Polymers", Science, Jun. 12, 1998, vol. 280, No. 5370, pp. 1741-1744, doi: 10.1126/science.280.5370.1741.
Slinker et al., "Direct measurement of the electric-field distribution in a light-emitting electrochemical cell", Nature Materials, Nov. 2007, Published Online Sep. 30, 2007, vol. 6, No. 11, pp. 894-899, doi: 10.1038/nmat2021.
Smits et al., "Response of Fe powder, purified and as-produced HiPco single-walled carbon nanotubes to flash exposure", Materials Science and Engineering, 2003, A358, pp. 384-389, doi:10.1016/S0921-5093(03)00282-X.
Swensen et al., "Light emission from an ambipolar semiconducting polymer field-effect transistor", Applied Physics Letters, Dec. 15, 2005, vol. 87, pp. 253511-1-253511-3.
Sze et al., "Physics of Semiconductor Devices", Third Edition, Wiley, Toronto, 1985, 763 pgs., (presented in five parts).
Takahashi et al., "Carbon nanotube active-matrix backplanes for conformal electronics and sensors", Nano Letters, Nov. 3, 2011, vol. 11, pp. 5408-5413, doi: 10.1021/nl203117h.
Takizawa et al., "Effective Antiscaling Performance of Reverse-Osmosis Membranes Made of Carbon Nanotubes and Polyamide Nanocomposites", ACS Omega, Jun. 5, 2018, vol. 3, No. 6, pp. 6047-6055, doi: 10.1021/acsomega.8b00601.
Tang et al., "Enhanced Flux and Electrochemical Cleaning of Silicate Scaling on Carbon Nanotube-Coated Membrane Distillation Membranes Treating Geothermal Brines", ACS Applied Materials & Interfaces, Oct. 13, 2017, vol. 9, No. 44, pp. 38594-38605, doi: 10.1021/acsami.7b12615.
Tang et al., "Organic electroluminescent diodes", Applied Physics Letters, Sep. 21, 1987, vol. 51, No. 12, pp. 913-915, doi: 10.1063/1.98799.
Tans et al., "Room-temperature transistor based on a single carbon nanotube", Nature, May 7, 1998, vol. 393, pp. 49-52.
Treacy et al., "Exceptionally High Young's Modulus Observed for Individual Carbon Nanotubes", Nature, Jun. 20, 1996, vol. 381, pp. 678-680, doi: 10.1038/381678a0.
Tunuguntla et al., "Enhanced Water Permability and Tunable Ion Selectivity in Subnanometer Carbon Nanotube Porins", Science, Aug. 25, 2017, vol. 357, No. 6353, pp. 792-796, doi: 10.1126/science.aan2438.
Wang et al., "Ultrahigh Frequency Carbon Nanotube Transistor Based on a Single Nanotube", IEEE Transactions on Nanotechnology, Jul. 9, 2007, vol. 6, No. 4, pp. 400-403, doi: 10.1109/TNANO.2007.901179.
Wang et al., "Wafer-scale fabrication of separated carbon nanotube thin-film transistors for display applications", Nano Letters, Nov. 10, 2009, vol. 9, No. 12, pp. 4285-4291, doi: 10.1021/nl902522f.
Wu et al., "Self-Assembly of Semiconducting Single-Walled Carbon Nanotubes into Dense, Aligned Rafts", Small, Jul. 11, 2013, vol. 9, No. 24, pp. 1-28, doi: 10.1002/smll.201301547.
Wu et al., "Top-down patterning and self-assembly for regular arrays of semiconducting single-walled carbon nanotubes", Advanced Materials, Jul. 22, 2014, vol. 26, pp. 6151-6156, doi: 10.1002/adma.201401108.
Xia et al., "Printed Sub-2 V Gel-Electrolyte-Gated Polymer Transistors and Circuits", Advanced Functional Materials, Jan. 11, 2010, vol. 20, pp. 587-594, doi: 10.1002/adfm.200901845.
Xu et al., "Vertical organic light emitting transistor", Applied Physics Letters, Aug. 30, 2007, vol. 91, 092991-1-092991-3, doi: 10.1063/1.2778751.
Yamauchi et al., "Fabrication of Vertical Organic Light-Emitting Transistor Using ZnO Thin Film", Japanese Journal of Applied Physics, Apr. 24, 2007, vol. 46, No. 4B, pp. 2678-2682, doi: 10.1143/JJAP.46.2678.

Yan et al., "A high-mobility electron-transporting polymer for printed transistors", Nature, Jan. 21, 2009, vol. 457, 10 pgs., doi: 10.1038/nature07727.
Yang et al., "Control of Cationic Conjugated Polymer Performance in Light Emitting Diodes by Choice of Counterion", Journal of the American Chemical Society, May 27, 2006, vol. 128, pp. 14422-14423, doi: 10.1021/ja063723c.
Young, "When Can I Get My AMOLED TV", Information Display, 2010, vol. 10, pp. 24-29.
Yu et al., "Microwave nanotube transistor operation at high bias", Applied Physics Letters, Jun. 8, 2006, vol. 88, 233115, pp. 233115-1-233115-3, doi: 10.1063/1.2210447.
Zaumseil et al., "Spatial control of the recombination zone in an ambipolar light-emitting organic transistor", Nature materials, Jan. 2006, vol. 5, pp. 69-74, Published Online Dec. 18, 2005.
Zhang et al., "Self-Enhanced Catalytic Activities of Functionalized Graphene Sheets in the Combustion of Nitromethane: Molecular Dynamic Simulations by Molecular Reactive Force Field", ACS Applied Materials & Interfaces, Jul. 23, 2014, vol. 6, pp. 12235-12244. doi: 10.1021/am501562m.
Zou et al., "Carbon nanotube driver circuit for 6x6 organic light emitting diode display", Scientific Reports, Jun. 29, 2015, vol. 5, No. 11755, pp. 1-9.
Definition of "form," Merriam Webster Online, Retrieved from the Internet on Feb. 20, 2016.
International Preliminary Report on Patentability for International Application PCT/US2017/031619, Report issued Nov. 12, 2019, dated Nov. 21, 2019, 8 pgs.
International Preliminary Report on Patentability for International Application PCT/US2014/066926, Report issued May 24, 2016, dated Jun. 6, 2016, 12 pgs.
International Preliminary Report on Patentability for International Application PCT/US2017/012161, Report issued Jul. 10, 2018, dated Jul. 19, 2018, 11 pgs.
International Search Report and Written Opinion for International Application No. PCT/US2016/064449, Search completed Mar. 17, 2017, dated Apr. 4, 2017, 12 pgs.
International Search Report and Written Opinion for International Application No. PCT/US2017/012161, Search completed Feb. 24, 2017, dated May 5, 2017, 14 pgs.
International Search Report and Written Opinion for International Application No. PCT/US2017/031619, Search completed Jul. 11, 2017, dated Aug. 14, 2017, 15 pgs.
International Search Report and Written Opinion for International Application No. PCT/US2018/031230, Search completed Jul. 16, 2018, dated Aug. 1, 2018, 13 pgs.
International Search Report and Written Opinion for International Application PCT/US2014/066926, Report Completed Feb. 2, 2015, dated Mar. 3, 2015, 14 pgs.
"Global Flat Panel Displays Market to Reach US$110 Billion by 2017", Global Industry Analysts, Inc., Mar. 15, 2012, 3 pgs.
"Large AMOLED gets a cost edge over LCD", Sector Report Display, Korea Investment & Securities Co., Ltd. Aug. 16, 2011, 32 pgs.
"LCD TV Growth Improving, As Plasma and CRT TV Disappear", NPD DisplaySearch, Apr. 16, 2014, 2 pgs.
"NSF Protocol P248 Military Operations Microbiological Water Purifiers", NSF International, Feb. 1, 2012, 6 pgs.
"Oxide TFT Production Forecast to Overtake LTPS in 2016", NPD DisplaySearch, Sep. 10, 2013, 4 pgs.
"Spin coating", Wikipedia, Oct. 23, 2015; Retrieved on Jul. 11, 2017, 2 pgs.
"Technical Bulletin Medical (TB MED) 577: Sanitary Control and Surveillance of Field Water Supplies", United States Department of the Army, 2013, 195 pgs.
Almudever et al., "Variability and reliability of CNFET technology: impact of manufacturing imperfections", Microelectronics Reliability, Feb. 1, 2015, vol. 55, No. 2, pp. 358-366.
Antaris et al., "Probing and Tailoring pH-Dependent Interactions between Block Copolymers and Single-Walled Carbon Nanotubes for Density Gradient Sorting", Journal of Physical Chemistry C, Aug. 28, 2012, vol. 116, No. 37, pp. 20103-20108, doi: 10.1021/jp3063564.

(56) References Cited

OTHER PUBLICATIONS

Aradhya et al., "Electrothermal Bonding of Carbon Nanotubes to Glass", Journal of The Electrochemical Society, Jul. 22, 2008, vol. 155, No. 9, pp. K161-K165.

Armstrong et al., "Enhanced Propellant Combustion with Nanoparticles", Nano Letters, Jan. 9, 2003, vol. 3, No. 2, pp. 253-255, doi: 10.1021/nl025905k.

Arnold et al., "Sorting carbon nanotubes by electric structure using density differentiation", Nature Nanotechnology, Oct. 2006, vol. 3, pp. 60-65.

Bachilo et al., "Structure-assigned optical spectra of single-walled carbon nanotubes", Science, Dec. 20, 2002, vol. 298, pp. 2361-2366, doi: 10.1126/science.1078727.

Ben-Sasson et al., "Patterned electrode vertical field effect transistor fabricated using block copolymer nanotemplates", Applied Physics Letters, Nov. 2009, vol. 95, pp. 213301-1-213301-3.

Bhat et al., "Electroluminescence in ion-gel gated conjugated polymer field-effect transistors", Chemistry of Materials, Oct. 7, 2012, vol. 24, pp. 4060-4067, doi: 10.1021/cm301610w.

Bonhommeau et al., "Raman spectroscopic investigation of individual single-walled carbon nanotubes helically wrapped by ionic, semiconducting polymers", Journal of Physical Chemistry C, Jun. 20, 2013, vol. 117, pp. 14840-14849, doi: 10.1021/jp4037606.

Brack et al., "Individual Soldier/Small Unit Desalination Device", Army SBIR Solicitation, Aug. 24-Oct. 24, 2018, Topic No. A18-149.

Brady et al., "Quasi-ballistic carbon nanotube array transistors with current density exceeding Si and GaAs", Science Advances, Sep. 2, 2016, vol. 2, No. 9, pp. 1-9, e1601240, doi: 10.1126/sciadv.1601240.

Braga et al., "High-Transconductance Organic Thin-Film Electrochemical Transistors for Driving Low-Voltage Red-Green-Blue Active Matrix Organic Light-Emitting Devices", Advanced Functional Materials, Feb. 14, 2012, vol. 22, pp. 1623-1631, doi: 10.1002/adfm.201102075.

Briseno et al., "Patterning Organic Single-Crystal Transistor Arrays", Nature, Dec. 14, 2006, vol. 444, pp. 913-917.

Bronikowski et al., "Gas-phase production of carbon single-walled nanotubes from carbon monoxide via the HiPco process: a parametric study", J Vac. Sci. Technol. A., May 2, 2001, vol. 19, pp. 1800-1805.

Brousseau et al., "Nanometric Aluminum in Explosives", Propellants, Explosives, Pyrotechnics, Feb. 27, 2002, vol. 27, pp. 300-306.

Cao et al., "Fringing-field dielectrophoretic assembly of ultrahigh-density semiconducting nanotube arrays with a self-limited pitch", Nature Communications, Sep. 26, 2014, vol. 5, No. 5071, doi: 10.1038/ncomms6071.

Cao et al., "Improved quantum efficiency for electroluminescence in semiconducting polymers", Nature, Feb. 4, 1999, vol. 397, pp. 414-417.

Cao et al., "Medium-scale carbon nanotube thin-film integrated circuits on flexible plastic substrate", Nature, Jul. 24, 2008, vol. 454, pp. 495-500, doi:10.1038/nature07110.

Cao et al., "Radio Frequency Transistors Using Aligned Semiconducting Carbon Nanotubes with Current-Gain Cutoff Frequency and Maximum Oscillation Frequency Simultaneously Greater than 70 GHz", ACS Nano, Jun. 21, 2016, vol. 10, No. 7, pp. 6782-6790, doi: 10.1021/acsnano.6b02395.

Capelli et al., "Organic light-emitting transistors with an efficiency that outperforms the equivalent light-emitting diodes", Nature Materials, Jun. 2010, vol. 9, pp. 496-503, published online May 2, 2010.

Chaban et al., "Buckybomb: Reactive Molecular Dynamics Simulation", Journal of Physics Chemistry Letters, Feb. 24, 2015, vol. 6, pp. 913-917, DOI: 10.1021/ acs.jpclett.5b00120.

Chang et al., "Improved Electrical Performance of MILC Poly-Si TFTs Using CF4 Plasma by Etching Surface of Channel", IEEE Electron Device Letters, Feb. 2009, vol. 30, No. 2, pp. 130-132, doi:10.1091/LED.2008.2010064.

Chen et al., "The Role of Metal-Nanotube Contact in the Performance of Carbon Nanotube Field-Effect Transistors", Nano Letters, Jun. 24, 2005, vol. 5, No. 7, pp. 1497-1502, doi: 10.1021/nl0508624.

Cherenack et al., "Amorphous-silicon thin-film transistors fabricated at 300° C. on a free-standing foil substrate of clear plastic", IEEE Electron Device Letters, Nov. 2007, vol. 28, No. 11, pp. 1004-1006.

Chiang et al., "Purification and Characterization of Single-Wall Carbon Nanotubes (SWNTs) Obtained from the Gas-Phase Decomposition of CO (HiPco Process)", J. Phys. Chem. B, Aug. 10, 2001, vol. 105, pp. 8297-8301, doi:10.1021/jp0114891.

Cho et al., "Printable ion-gel gate dielectrics for low-voltage polymer thin-film transistors on plastic", Nature Materials, Nov. 2008, Published Online Oct. 19, 2008, vol. 7, pp. 900-906, doi: 10.1038/nmat2291.

Chortos et al., "Investigating Limiting Factors in Stretchable All-Carbon Transistors for Reliable Stretchable Electronics", ACS Nano, Jul. 26, 2017, vol. 11, pp. 7925-7937, doi: 10.1021/acsnano.7b02458.

Chortos et al., "Mechanically Durable and Highly Stretchable Transistors Employing Carbon Nanotube Semiconductor and Electrodes", Advanced Materials, 2016, Published Online Jul. 14, 2015, vol. 28, pp. 4441-4448, doi: 10.1002/adma.201501828.

Culp et al., "Electron Tomography Reveals Details of the Internal Microstructure of Desalination Membranes", PNAS, Aug. 28, 2018, vol. 115, No. 35, pp. 8694-8699, doi: 10.1073/pnas.1804708115.

Dai et al., "Solution-processed, high-performance light-emitting diodes based on quantum dots", Nature, Nov. 6, 2014, vol. 515, pp. 96-99.

De Volder et al., "Carbon nanotubes: present and future commercial applications", Science, Feb. 1, 2013, vol. 339, pp. 535-539.

Dlott, "Thinking big (and small) about energetic materials", Materials Science and Technology, Apr. 2006, vol. 22, No. 4, pp. 463-473, doi:10.1179/174328406X83987.

Drandova et al., "SiN capacitors and ESD", CS Mantech Conference, Apr. 24-27, 2006, pp. 83-86.

Dreizin, "Metal-based reactive nanomaterials", Progress in Energy and Combustion Science, Apr. 2009, vol. 35, pp. 141-167, doi:10.1016/j.pecs.2008.09.001.

Dresselhaus et al., "Raman spectroscopy on isolated single wall carbon nanotubes", Carbon, 2002, vol. 40, pp. 2043-2061.

Droudian et al., "Enhanced Chemical Separation by Freestanding CNT-Polyamide/Imide Nanofilm Synthesized at the Vapor-Liquid Interface", ACS Applied Materials & Interfaces, May 29, 2018, vol. 10, No. 23, pp. 19305-19310, doi: 10.1021/acsami.8b02329.

Friend et al., "Electroluminescence in conjugated polymers", Nature, Jan. 14, 1999, vol. 397, pp. 121-128.

Gao et al., "Complementary Logic Gate Arrays Based on Carbon Nanotube Network Transistors", Small, 2013, vol. 9, No. 6, pp. 813-819.

Ghosh et al., "Advanced sorting of single-walled carbon nanotubes by nonlinear density-gradient ultracentrifugation", Nature Nanotechnology, May 9, 2010, vol. 5, pp. 443-450.

Gu et al., "Design of flat panel displays based on organic light emitting devices", IEEE Journal of Selected Optics in Quantum Electronics, Jan./Feb. 1998, vol. 4, pp. 83-99.

Gundlach et al., "Pentacene Organic Thin-Film Transistors—Molecular Ordering and Mobility", IEEE Electron Device Letters, Mar. 1997, vol. 18, No. 3, pp. 87-89.

Ha et al., "Highly Uniform and Stable n-Type Carbon Nanotube Transistors by Using Positively Charged Silicon Nitride Thin Films", Nano Letters, 2015, vol. 15, pp. 392-397, published Dec. 1, 2014.

Hennrich et al., "Length-Sorted, Large-Diameter, Polyfluorene-Wrapped Semiconducting Single-Walled Carbon Nanotubes for High-Density, Short-Channel Transistors", ACS Nano, Jan. 2016, vol. 10, No. 2, pp. 1888-1895, doi: 10.1021/acsnano.5b05572.

Hinds et al., "Aligned Multiwalled Carbon Nanotube Membranes", Science, Jan. 2, 2004, vol. 303, No. 5654, pp. 62-65, doi: 10.1126/science.1092048.

Ho et al., "Molecular-scale interface engineering for polymer light-emitting diodes", Nature, Mar. 30, 2000, vol. 404, No. 6777, pp. 481-484.

(56) References Cited

OTHER PUBLICATIONS

Holt et al., "Fast Mass Transport Through Sub-2-Nanometer Carbon Nanotubes", Science, May 19, 2006, vol. 312, No. 5776, pp. 1034-1037, doi: 10.1126/science.1126298.

Hone et al., "Thermal properties of carbon nanotubes and nanotube-based materials", Applied Physics A, Mar. 4, 2002, vol. 74, pp. 339-343.

Hoven et al., "Electron injection into organic semiconductor devices from high work function cathodes", Proceedings of the National Academy of Sciences of the United States of America, Sep. 2, 2008, vol. 105, No. 35, pp. 12730-12735.

Hoven et al., "Ion motion in conjugated polyelectrolyte electron transporting layers", Journal of the American Chemical Society, 2007, vol. 129, No. 36, pp. 10976-10977, doi: 10.1021/ja072612q.

Hsu et al., "Control of Efficiency, Brightness, and Recombination Zone in Light-Emitting Field Effect Transistors", Advanced Materials, Jan. 25, 2012, vol. 24, pp. 1171-1175, doi: 10.1002/adma.201103513.

Iechi et al., "Vertical type organic light emitting device using thin-film ZnO electrode", Synthetic Metals, 2005, vol. 154, pp. 149-152.

Inukai et al., "High-Performance Multifunctional Reverse Osmosis Membranes Obtained by Carbon Nanotube Polyamide Nanocomposite", Scientific Reports, Sep. 3, 2015, vol. 5, No. 13562, pp. 1-10, doi: 10.1038/srep13562.

Isert et al., "The effect of encapsulated nanosized catalysts on the combustion of composite solid propellants", Combustion and Flame, 2015, Published Online Dec. 23, 2014, vol. 162, pp. 1821-1828.

Javey et al., "Ballistic carbon nanotube field-effect transistors", Nature, Aug. 7, 2003, vol. 424, pp. 654-657.

Javey et al., "High-K dielectrics for advanced carbon-nanotube transistors and logic gates", Nature Materials, Dec. 2002, vol. 1, pp. 241-245, published online Nov. 17, 2002.

Javey et al., "Self-aligned ballistic molecular transistors and electrically parallel nanotube arrays", Nano Letters, May 24, 2004, vol. 4, No. 7, pp. 1319-1322.

Joo et al., "Dose-Controlled, Floating Evaporative Self-assembly and. Alignment of Semiconducting Carbon Nanotubes from Organic Solvents", Langmuir, Mar. 2, 2014, vol. 30, No. 12, pp. 3460-3466, doi: 10.1021/la500162x.

Kawai et al., "Self-formation of highly aligned metallic, semiconducting and single chiral single-walled carbon nanotubes assemblies via a crystal template method", Applied Physics Letters, Sep. 4, 2014, vol. 105, 093102, pp. 093102-1-093102-4, doi: 10.1063/1.4895103.

Kawai et al., "Single Chirality Extraction of Single-Wall Carbon Nanotubes for the Encapsulation of Organic Molecules", Journal of the American Chemical Society, 2012, vol. 134, No. 23, pp. 9545-9548, doi: 10.1021/ja3013853.

Keplinger et al., "Stretchable, Transparent, Ionic Conductors", Science, Aug. 30, 2013, vol. 341, No. 6149, pp. 984-987, doi: 10.1126/science.1240228.

Kim et al., "Electrical contacts to carbon nanotubes down to 1 nm in diameter", Applied Physics Letters, Oct. 17, 2005, vol. 87, pp. 173101-1-173101-3.

Kim et al., "Polymer gate dielectric surface viscoelasticity modulates pentacene transistor performance", Science, Oct. 5, 2007, vol. 318, pp. 76-80.

Kimura et al., "Low- temperature polysilicon thin-film transistor driving with integrated driver for high resolution light emitting polymer display", IEEE Transactions on Electron Devices, Dec. 1999, vol. 46, Issue 12, pp. 2282-2288.

Krupke et al., "Contacting single bundles of carbon nanotubes with alternating electric fields", Applied Physics A, Jan. 31, 2002, vol. 76, No. 3, pp. 397-400, doi: 10.1007/s00339-002-1592-4.

Kudo, "Organic light emitting transistors", Current Applied Physics, 2005, First Published Jun. 7, 2004, vol. 5, pp. 337-340, doi: 10.1016/j.cap.2003.11.095.

Li et al., "Carbon Nanotube Transistor Operation at 2.6 GHz", Nano Letters, 2004, vol. 4, No. 4, pp. 753-756, doi: 10.1021/nl0498740.

Li et al., "Effects of Ambient Air and Temperature on Ionic Gel Gated Single-Walled Carbon Nanotube Thin-Film Transistor and Circuits", ACS Applied Materials & Interfaces, Sep. 29, 2015, vol. 7, No. 41, pp. 22881-22887, doi: 10.1021/acsami.5b05727.

Li et al., "Electrochemical Oxidations of p-Doped Semiconducting Single-Walled Carbon Nanotubes", Journal of Nanotechnology, Nov. 1, 2016, vol. 2016, No. 8073593, 8 pages, doi: 10.1155/2016/8073593.

Li et al., "Electronically Pure Single-Chirality Semiconducting Single-Walled Carbon Nanotube for Large-Scale Electronic Devices", ACS Applied Materials & Interfaces. Aug. 3, 2016. vol. 8, No. 32, pp. 20527-20533.

Li et al., "Langmuir-Blodgett Assembly of Densely Aligned Single-Walled Carbon Nanotubes from Bulk Materials", Journal of the American Chemical Society, Feb. 15, 2007, vol. 129, No. 16, pp. 4890-4891, doi: 10.1021/ja071114e.

Li et al., "Molecular Design, Device Function and Surface Potential of Zwitterionic Electron Injection Layers", Journal of the American Chemical Society, Mar. 17, 2009, vol. 131, No. 25, pp. 8903-8912, doi: 10.1021/ja9018836.

Li et al., "Polyfluorinated electrolyte for fully printed carbon nanotube electronics", Advanced Functional Materials, Aug. 3, 2016, vol. 26, No. 38, pp. 6914-6920, doi: 10.1002/adfm.201601605.

Li et al., "Silicon nitride gate dielectric for top-gated carbon nanotube field effect transistors", Journal of Vacuum Science & Technology B 22, Dec. 10, 2004, pp. 3112-3114.

Li et al., "The Effect of Interface States on Single-Walled Carbon Nanotube Transistors", ECS Journal of Solid State Science and Technology, Aug. 5, 2016, vol. 5, pp. M93-M98, doi: 10.1149/2.0271609jss.

Li et al., "Transfer printing of submicrometer patterns of aligned carbon nanotubes onto functionalized electrodes", Small, Feb. 12, 2007, vol. 3, No. 4, pp. 616-621, doi: 10.1002/smll.200600525.

Li et al., "Visualizing Helical Wrapping of Semiconducting Single-Walled Carbon Nanotubes by Surfactants and Their Impacts on Electronic Properties", Chemistry Select, Aug. 3, 2016, vol. 1, No. 13, 5 pgs, doi: 10.1002/slct.201601033.

Liang et al., "Elastomeric polymer light-emitting devices and displays", Nature Photonics, Oct. 2013, Published Online Sep. 22, 2013, vol. 7, pp. 817-824, doi: 10.1038/NPHOTON.2013.242.

Lin et al., "A novel LTPS-TFT pixel circuit compensating for TFT threshold-voltage shift and OLED degradation for AMOLED", IEEE Electron Device Letters, Feb. 2007, vol. 28, No. 2, pp. 129-131.

Lin et al., "Ambipolar-to-Unipolar Conversion of Carbon Nanotube Transistors by Gate Structure Engineering", Nano Letters, Mar. 12, 2004, vol. 4, No. 5, pp. 947-950.

Lin et al., "The Impact of Scaling-Down Oxide Thickness on Poly-Si Thin-Film Transistors' I-V Characteristics", IEEE electron device letters, Apr. 1994, vol. 15, No. 4, pp. 138-139.

Liu et al., "Large-scale single-chirality separation of single-walled carbon nanotubes by simple gel chromatography", Nature Communications, May 10, 2011, vol. 2, No. 309, pp. 1-8.

Logdlund et al., "Theoretical-studies of the interaction between aluminum and poly(pphenylenevinylene) and derivatives", The Journal of Chemical Physics, Sep. 1, 1994, vol. 101, pp. 4357-4364, doi: 10.1063/1.467486.

Maehashi et al., "Electrical characterization of carbon nanotube field-effect transistors with SiN x passivation films deposited by catalytic chemical vapor deposition", Applied Physics Letters, May 9, 2008, vol. 92, pp. 183111-1-183111-3; doi:10.1063/1.2920206.

Matyba et al., "The dynamic organic p-n junction", Nature Materials, Aug. 2009, Published Online Jun. 21, 2009, vol. 8, No. 8, pp. 672-676, doi: 10.1038/NMAT2478.

McCarthy et al., "Low-Voltage, Low-Power, Organic Light-Emitting Transistors for Active Matrix Displays", Science, Apr. 29, 2011, vol. 332, Issue 6029, pp. 570-573, doi: 10.1126/science.1203052.

McGinnis et al., "Large-Scale Polymeric Carbon Nanotube Membranes with Sub-1.27-nm Pores", Science Advances, Mar. 9, 2018, vol. 4, No. e1700938, doi: 10.1126/sciadv.1700938.

(56) References Cited

OTHER PUBLICATIONS

Meda et al., "Nano-aluminum as energetic material for rocket propellants", Materials Science and Engineering C, 2007, vol. 27, Issues 5-8, pp. 1393-1396, doi: doi:10.1016/j.msec.2006.09.030.

Meda et al., "Nano-composites for rocket solid propellants", Composites Science and Technology, 2005, vol. 65, Issue 5, pp. 769-773.

Muccini, "A bright future for organic field-effect transistors", Nature Materials, Aug. 2006, vol. 5, No. 8, pp. 605-613.

Nakamura et al., "Improvement of Metal-Insulator-Semiconductor-Type Organic Light-Emitting Transistors", Japanese Journal of Applied Physics, Mar. 21, 2008, vol. 47, No. 3, pp. 1889-1893, doi: 10.1143/JJAP.47.1889.

Noh et al., "Ultra-thin polymer gate dielectrics for top-gate polymer field-effect transistors", Organic Electronics, 2009, Published Online Nov. 12, 2008, vol. 10, No. 1, pp. 174-180, doi: 10.1016/j.orgel.2008.10.021.

Nomura et al., "Room-temperature fabrication of transparent flexible thin-film transistors using amorphous oxide semiconductors", Nature, Nov. 25, 2004, vol. 432, pp. 488-492.

O'Connell et al., "Band gap fluorescence from individual single-walled carbon nanotubes", Science, Jul. 26, 2002, vol. 297, pp. 593-596.

Oh et al., "Vertical Type Organic Transistor Using C60 and its Application for OLET", Molecular Crystals and Liquid Crystals, Dec. 21, 2006, vol. 458, No. 1, pp. 247-254, doi: 10.1080/15421400600932439.

Ortiz-Medina et al., "Robust Water Desalination Membranes Against Degradation Using High Loads of Carbon Nanotubes", Scientific Reports, Feb. 9, 2018, vol. 8, No. 2748, doi: 10.1038/s41598-018-21192-5.

Panzer et al., "Low-voltage operation of a pentacene field-effect transistor with a polymer electrolyte gate dielectric", Applied Physics Letters, Feb. 28, 2005, vol. 86, pp. 103503-1-103503-3.

Park et al., "Enhanced luminescence in top-gate-type organic light-emitting transistors", Applied Physics Letters, Aug. 16, 2004, vol. 85, No. 7, pp. 1280-1282.

Park et al., "Flexible full color organic light emitting diode display on polyimide plastic substrate driven by amorphous indium gallium zinc oxide thin-film transistors", Applied Physics Letters, Jul. 6, 2009, vol. 95, No. 1, pp. 013503-1-013503-3, doi: 10.1063/1.3159832.

Park et al., "High-density integration of carbon nanotubes via chemical self-assembly", Nature Nanotechnology, Oct. 28, 2012, vol. 7, pp. 787-791, doi: 10.1038/nnano.2012.189.

Park et al., "High-resolution electrohydrodynamic jet printing", Nature Materials, Oct. 2007, vol. 6, pp. 782-789, doi: 10.1038/nmat1974, published online Aug. 5, 2007.

Park et al., "Large-Area Assembly of Densely Aligned Single-Walled Carbon Nanotubes Using Solution Shearing and Their Application to Field-Effect. Transistors", Advanced Materials, Mar. 18, 2015, vol. 27, No. 16, pp. 2656-2662, doi: 10.1002/adma.201405289.

Pei et al., "Polymer Light-Emitting Electrochemical Cells", Science, Aug. 25, 1995, vol. 269, No. 5227, pp. 1086-1088.

Perebeinos et al., "Schottky-to-Ohmic Crossover in Carbon Nanotube Transistor Contacts", Physical Review Letters, week ending Dec. 4, 2013,. vol. 111, pp. 236802-1-236802-5, plus supplemental material.

Pivkina et al., "Nanomaterials for Heterogeneous Combustion", Propellants, Explosives, Pyrotechnics, Feb. 26, 2004, vol. 29 , No. 1, pp. 39-48; DOI: 10.1002/prep.200400025.

\* cited by examiner

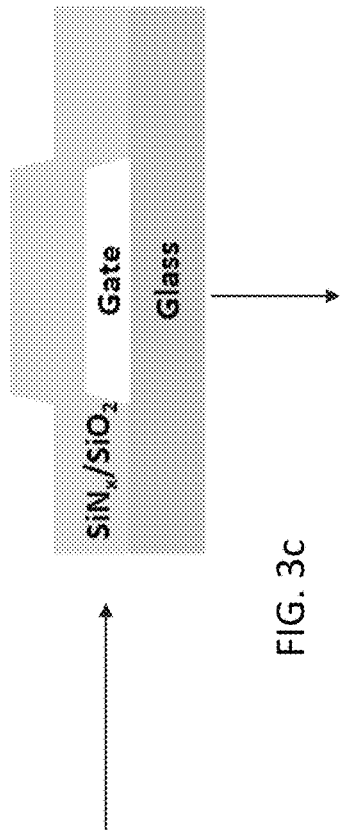
FIG. 3a
FIG. 3b
FIG. 3c
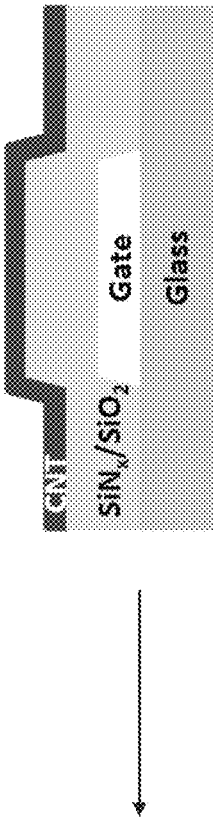
FIG. 3d
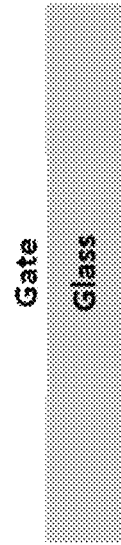
FIG. 3e
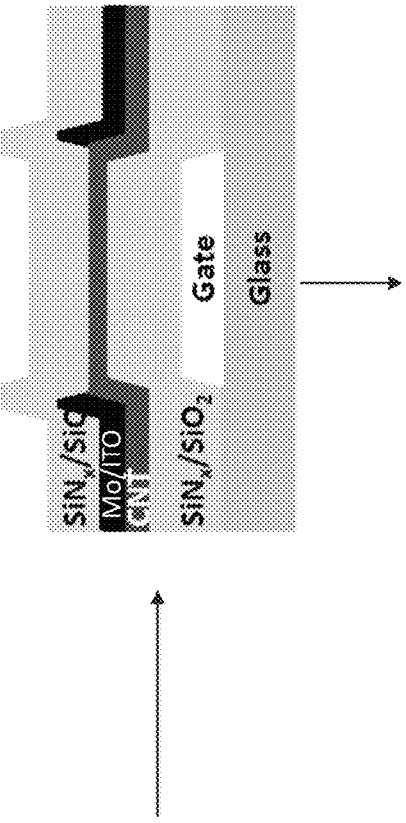
FIG. 3f
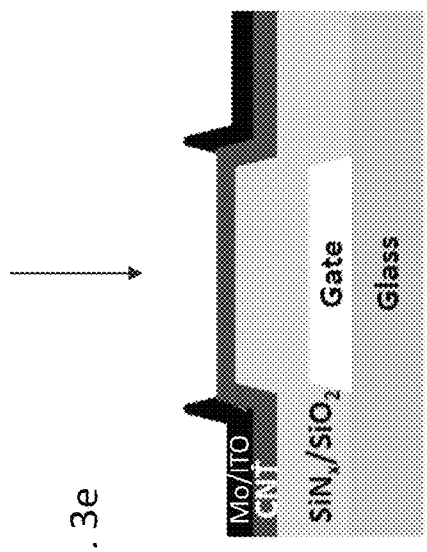

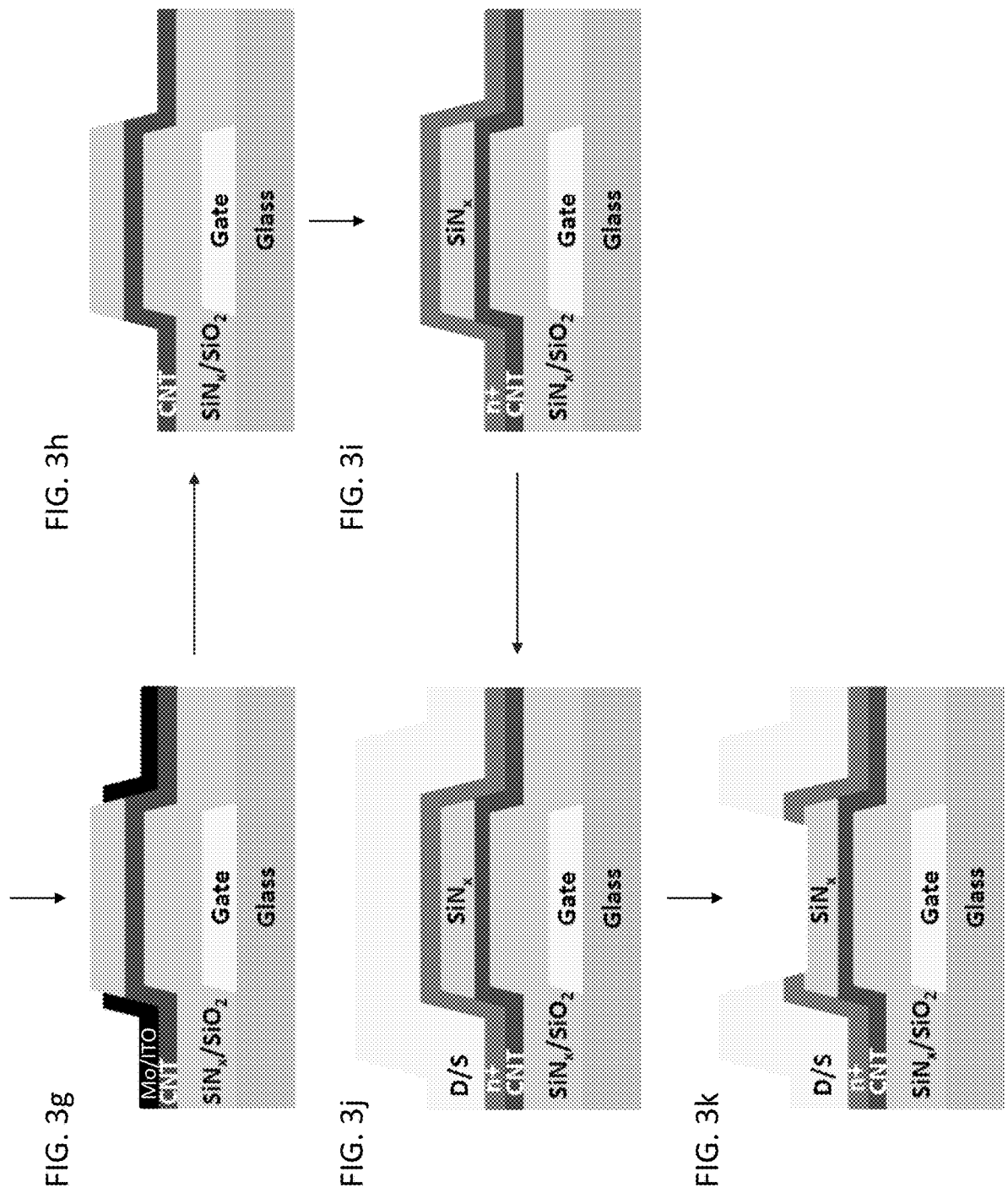

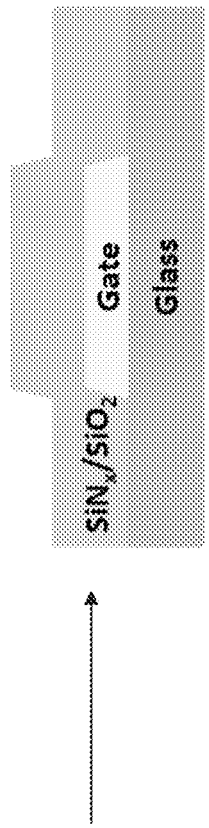
FIG. 4a
FIG. 4b
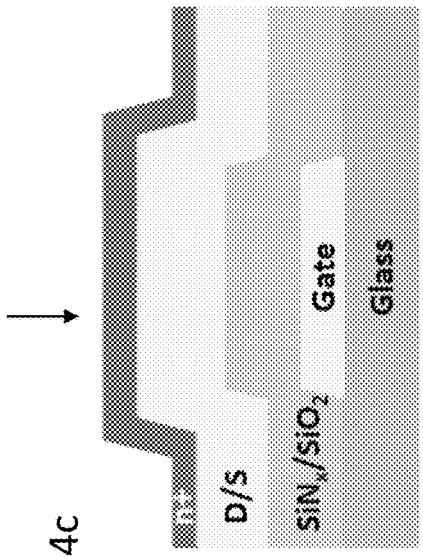
FIG. 4c
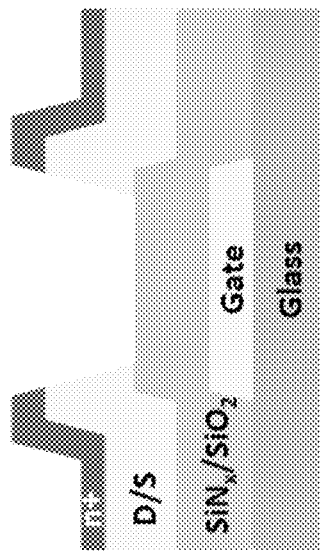
FIG. 4d
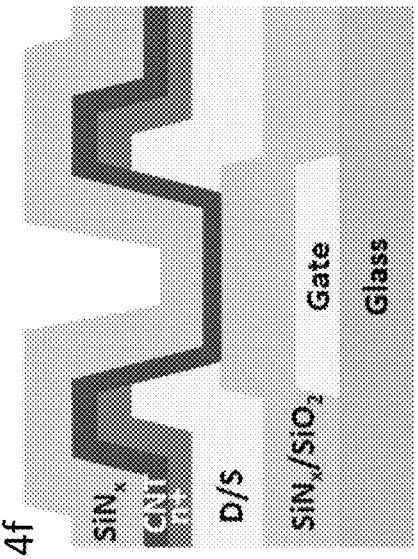
FIG. 4e
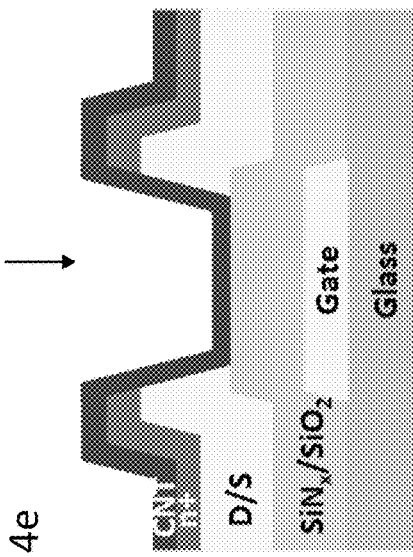
FIG. 4f

MANUFACTURING OF CARBON NANOTUBE THIN FILM TRANSISTOR BACKPLANES AND DISPLAY INTEGRATION THEREOF

CROSS-REFERENCE TO RELATED APPLICATIONS

The current application is a continuation-in-part of U.S. patent application Ser. No. 15/589,896, filed May 8, 2017, and claims priority to U.S. Provisional Patent Application No. 62/758,376, filed Nov. 9, 2018, the disclosures of which is incorporated herein by reference in their entireties.

FIELD OF THE INVENTION

Methods for manufacturing carbon nanotube thin film transistor backplanes and their integration into displays under industrial conditions.

BACKGROUND OF THE INVENTION

Flat Panel Displays (FPDs) have infiltrated consumer electronics that are integrated with display functions. Among existing FPDs, Thin film transistor (TFT)—liquid crystal displays (LCDs) dominate the current display marketplace with a 97.5% market share in 2013 even though there are certain limitations on color, contrast, and response time. More recently, display capital expenditures have rapidly shifted from TFT-LCDs to AMOLEDs, not only because of the superior display qualities of color, contrast and response time, but also large AMOLEDs in Gen 8 or larger fabrications have a cost edge over TFT-LCDs. To be able to fabricate greater than Gen 8 size AMOLEDs, there are several technology challenges, including limitations in conventional active matrix thin-film transistor (TFT) backplanes. (See, e.g., G. Gu and S. R. Forrest, *IEEE Journal of Selected Topics in Quantum Electronics*, vol. 4, pp. 83-99, 1998, the disclosure of which is incorporated herein by reference.)

The current active matrix TFT backplanes used to drive AM-LCD pixels are typically made of amorphous silicon (a-Si), which has a low mobility ($\sim 1$ cm$^2$V$^{-1}$s$^{-1}$) and poor stability, and is therefore unsuitable for AMOLED pixels. (See, M. J. Powell, *IEEE Transactions on Electron Devices*, vol. 36, pp. 2753-2763, 1989, the disclosure of which is incorporated herein by reference.) As a result of these deficiencies, currently AMOELD displays are driven by low temperature polycrystalline silicon (poly-Si) TFTs that suffer from high fabrication cost and time, and device size, orientation, and inhomogeneity limitations, all of which present a severe challenge to increasing display size and production yield. (See, e.g., C. -P. Chang and Y.-C. S. Wu, *IEEE electron device letters*, vol. 30, pp. 130-132, 2009; Y.-J. Park, M.-H. Jung, S.-H. Park and O. Kim, *Japanese Journal of Applied Physics*, vol. 49, pp. 03CD01, 2010; and P.-S. Lin, and T.-S. Li, *IEEE electron device letters*, vol. 15, pp. 138-139, 1994, each of the disclosures of which are incorporated herein by reference.)

Although low temperature polycrystalline silicon (LTPS) backplanes have been under mass production up to Gen 5.5, LTPS fabrication techniques including excimer laser annealing (ELA) and advanced solid phase crystallization (ASPC) creates substantial hurdles for >Gen 8 scale-up. For example, both ELA and ASPC fabs have a very slow total average cycle time, more than twice of the typical 60 sec for a-Si. This doubles the capital cost for the array process of a-Si. Additionally, scale-up of ELA could cause non-uniformity and array failure. The high temperature of the ASPC process (~600° C.) requires expensive glass to avoid glass warping and shrinkage. (B. Young, Information Display, vol. 10, pp. 24, 2010, the disclosure of which is incorporated herein by reference.) The higher processing temperatures and more complicated photomask required to manufacture LTPS increases capex and the difficulty of achieving high yield rates. This makes a 5" LTPS TFT-LCD (1920×1080 pixels) 14% more expensive than a same size a-Si TFT-LCD.

Accordingly, a need exists for manufacturing techniques to allow for the production of less expensive TFT backplanes.

SUMMARY OF THE INVENTION

Methods for manufacturing carbon nanotube thin film transistor backplanes and their integration into displays are provided.

Many embodiments are directed to methods for manufacturing a single-walled carbon nanotube thin film transistor backplane including:
providing a substrate;
depositing an insulator comprised of a thin-film layer of single-walled carbon nanotubes atop said substrate; and
patterning at least a drain and a source electrode, a dielectric, one or more top-gated electrodes and one or more pixel electrodes atop the insulator using a photomask and photolithography process.

In other embodiments the insulator is deposited by a spraying technique selected from the group consisting of aerosol spray, air spray and ultrasonic spray.

In some such embodiments the single-walled carbon nanotube aerosol is formed by a technique selected from ultrasonic atomization at a voltage that ranges from 20 to 48 V, and pneumatic atomization with about 600 cubic centimeters per minute atomizer flow to generate aerosol in diameter of about 1 to 5 μm; and wherein the aerosol is brought to a spraying head by a carrier gas flow of from about 10 to 20 cubic centimeters per minute.

In still other such embodiments the single-walled carbon nanotube aerosol is formed from an aqueous solution of single-walled carbon nanotubes that are ultrasonicated in an ultrasonicating nozzle and emitted in a carrier gas flow of from about 10 to 20 cubic centimeters per minute.

In yet other embodiments the insulator is printed atop the substrate using aerosol jet printing as a single-walled carbon nanotube aerosol.

In some such embodiments the single-walled carbon nanotube aerosol is formed by a technique selected from ultrasonic atomization at a voltage that ranges from 20 to 48 V and pneumatic atomization with ~600 cubic centimeters per minute atomizer flow to generate the aerosol in a diameter of from 1 to 5 μm; and wherein the aerosol is brought to a fine nozzle of less than 100 μm by a carrier gas flow of from 10 to 20 cubic centimeters per minute and focused with a sheath gas flow of from 25 to 50 ccm.

In other such embodiments the deposited linewidth is less than 10 μm with a <2 μm registration accuracy.

In still other embodiments the single-walled carbon nanotubes are high purity single chirality single-walled carbon nanotubes.

In some such embodiments the single-walled carbon nanotubes have an index selected from (6,4), (9,1), (8,3), (6,5), (7,3), (7,5), (10,2), (8,4), (7,6), (9,2), and mixtures thereof.

In still yet other embodiments the single-walled carbon nanotube thin film is formed of a plurality of discrete thin films.

In some such embodiments the discrete single-walled carbon nanotube thin films are patterned using one photomask photolithography process.

In still yet other embodiments the method further includes treating the single-walled carbon nanotube thin film with acidic gas.

In some such embodiments the acidic gas is deposited via aerosol spraying.

In still some other such embodiments the method further includes washing the treated single-walled carbon nanotube thin film with isopropanol.

In yet some other such embodiments the method further includes sintering the single-walled carbon nanotube thin film at a temperature from around 100 to 200° C.

In still yet other embodiments the thin films are formed with subthreshold leakage current including:
- spin coating a photoresist on the single-walled carbon nanotube thin film;
- defining a pattern atop the photoresist by photolithography to create regions of a defined photoresist and undefined photoresist;
- solution developing the defined pattern to form a developed photoresist; and
- plasma or wet etching the single-walled carbon nanotubes thin film using the developed photoresist to form a patterned single-walled carbon nanotube thin film.

In still yet other embodiments the method includes integrating the single-walled carbon nanotube thin film transistor backplane into a display device.

Various other embodiments are directed to systems configured to deposit a single-walled carbon nanotube thin film transistor backplane including:
- a plurality of printer heads mounted in association with a moving station;
- the plurality of printer heads in fluid communication with a solution of an aqueous solution of single-walled carbon nanotubes for depositing a thin film of the single-walled carbon nanotubes atop a substrate disposed on the moving station; and
- wherein the printer heads are integrated with a photomask and photolithography process for patterning and forming at least a drain and a source electrode, a dielectric, one or more top-gated electrodes and one or more pixel electrodes atop the deposited thin film.

Some other embodiments are directed to methods for manufacturing a single-walled carbon nanotube thin film transistor backplane including:
- providing a substrate;
- patterning a gate electrode and dielectric layer on the substrate to form a channel;
- depositing a solution of a thin-film layer of single-walled carbon nanotubes on said dielectric layer to form a back-layer; and
- patterning at least a n+ layer, and a drain and a source electrode on the back-layer using a photomask and photolithography process such that the portion of the back-layer overlapping the channel is exposed.

In some such embodiments the back-layer is deposited by a spraying technique selected from the group consisting of aerosol spray, air spray and ultrasonic spray.

In still some such embodiments the single-walled carbon nanotube aerosol is formed from an aqueous solution of single-walled carbon nanotubes that are ultrasonicated in an ultrasonicating nozzle and emitted in a carrier gas flow.

In yet some such embodiments the back-layer is printed atop the substrate using aerosol jet printing as a single-walled carbon nanotube aerosol.

In still yet some such embodiments the single-walled carbon nanotube aerosol is formed by a technique selected from ultrasonic atomization and pneumatic atomization.

In still yet some such embodiments the single-walled carbon nanotubes adhere onto the dielectric through hydrophobicity forces with a peel off force of at least 4.35 N/cm$^2$.

In still yet some such embodiments the substrate comprises at least a Gen 4.5 glass.

In still yet some such embodiments the single-walled carbon nanotubes are high purity single chirality single-walled carbon nanotubes.

In still yet some such embodiments the single-walled carbon nanotubes have an index selected from (6,4), (9,1), (8,3), (6,5), (7,3), (7,5), (10,2), (8,4), (7,6), (9,2), and mixtures thereof.

In still yet some such embodiments the single-walled carbon nanotube thin film is formed of a plurality of discrete thin films.

In still yet some such embodiments the methods further include depositing and patterning an etch stop layer atop the back-layer such that the etch stop overlaps the channel.

In still yet some such embodiments the methods further include treating the single-walled carbon nanotube thin film with an acidic etch.

In still yet some such embodiments the acidic etch is selected from a group consisting of 5% $H_3PO_4$, 15% $HNO_3$, and 5% Acetic Acid.

In still yet some such embodiments further include washing the treated single-walled carbon nanotube thin film.

In still yet some such embodiments further include sintering the single-walled carbon nanotube thin film at a temperature of at least 1100° C.

In still yet some such embodiments the thin films are formed with subthreshold leakage current including:
- spin coating a photoresist on the single-walled carbon nanotube thin film;
- defining a pattern atop the photoresist by photolithography to create regions of a defined photoresist and undefined photoresist;
- solution developing the defined pattern to form a developed photoresist; and
- plasma or wet etching the single-walled carbon nanotubes thin film using the developed photoresist to form a patterned single-walled carbon nanotube thin film.

In still yet some such embodiments the patterning comprises a chemical vapor deposition technique.

In still yet some such embodiments the patterning includes the use of a $SiN_x$ material.

In still yet some such embodiments the chemical vapor deposition technique comprises one of either a Unaxis 790 or STS device.

In still yet some such embodiments the chemical vapor deposition technique uses a Unaxis 790 device with a ratio of ammonium to silane of 10 to 5.3 sccm.

In still yet some such embodiments the chemical vapor deposition technique uses an STS device with a ratio of ammonium to silane of around 1 to 1 sccm.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as exemplary embodiments of the invention and should not be construed as a complete recitation of the scope of the invention, wherein:

FIGS. 3a-3k provide schematic illustrations of methods of forming etch-stop vertical light emitting transistors in accordance with embodiments.

FIGS. 4a-4f provide schematic illustrations of methods of forming vertical light emitting transistors in accordance with embodiments.

DETAILED DESCRIPTION OF THE INVENTION

Figure 1A:
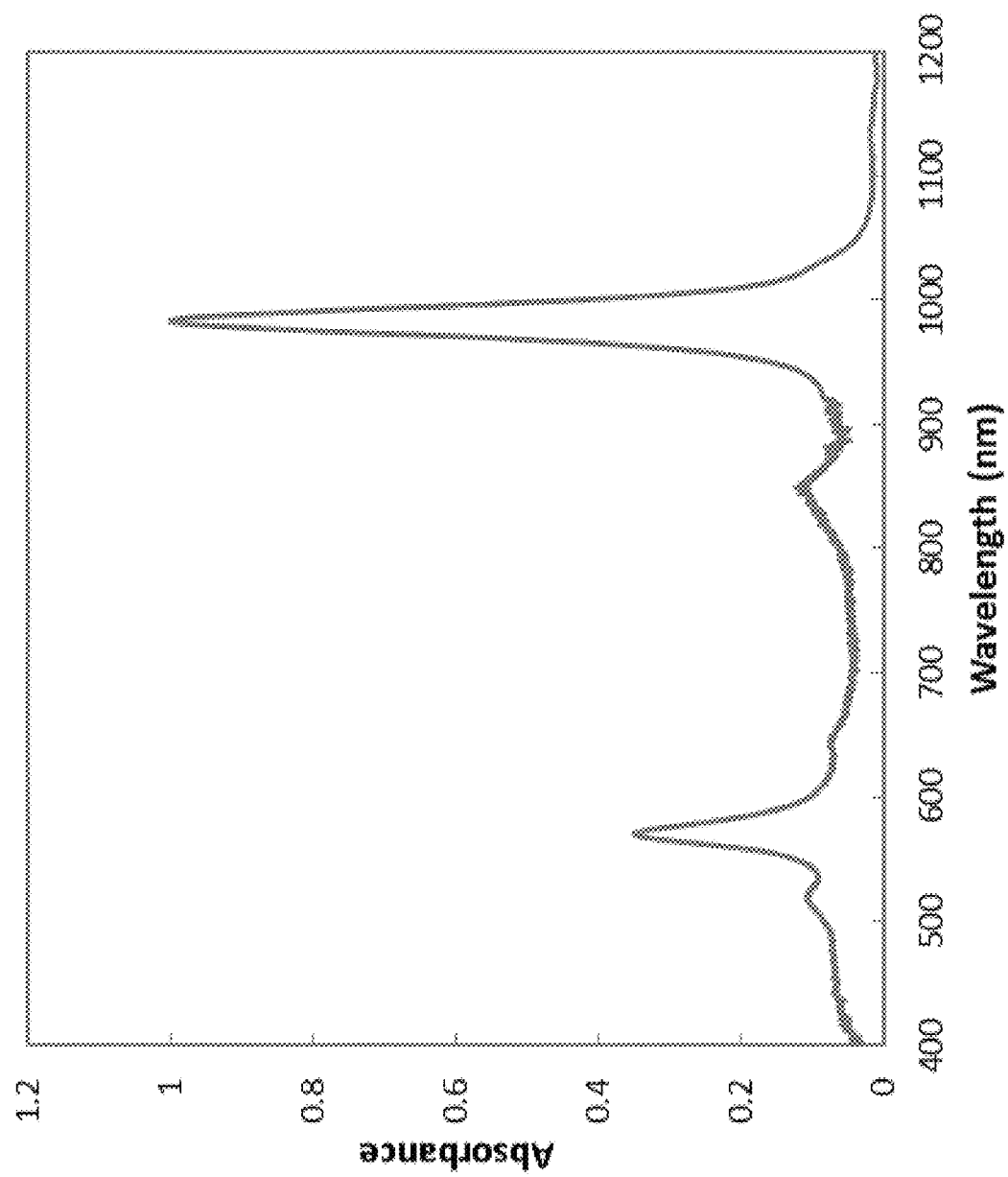
FIGS. 1a and 1b provide data graphs showing the absorption spectrum and electrical properties of single-wall carbon nanotubes in accordance with embodiments of the invention.

Turning to the drawings, devices, materials and methods for producing and integrating single-walled carbon nanotubes (SWCNT) into existing TFT backplane manufacturing lines. In particular, in contrast to LTPS and oxide TFT backplanes, SWCNT TFT backplanes exhibit either equivalent or better figures of merit such as high field emission mobility, low temperature fabrication, good stability, uniformity, scalability, flexibility, transparency, mechanical deformability, low voltage and low power, bendability and low cost. Accordingly, many embodiments are directed to methods and process for integrating SWCNTs technologies into existing TFT backplane manufacturing lines, pilot test and mass production can start without additional capex needs. Moreover, other embodiments are directed to methods and processes for integrating such SWCNT TFT backplanes into video displays, including, in various embodiments high-end glassless 3-D and ultra-definition panel displays such as Helmet-Mounted Display (HMD). In the following text, carbon nanotubes refer to single-walled carbon nanotubes, including high purity single chirality SWCNT, such as SWCNTs with indexes of (6,4), (9,1), (8,3), (6,5), (7,3), (7,5), (10,2), (8,4), (7,6), (9,2) and mixtures thereof.

Active matrix organic light emitting displays (AMO-LEDs) are highly attractive due to their power saving, ultra-high definition, and broad viewing angles. In particular, advances in organic light emitting transistors (OLETs) exhibit improved external efficiency over organic light emitting diodes (OLEDs) by directly modulating charge carriers of light emitting materials. Further, inducing a vertical structure in OLETs circumvents the intrinsic low mobility of organic materials by providing short channel length, thereby making it possible to achieve high conductance at low power and low voltages, thus enhancing the energy conversion efficiency, the lifetime and stability of the organic materials. Moreover, combining thin film transistor (TFT) switching and OLED light emitting properties in a single device leads to a simplified fabrication process and reduced cost. However, technical challenges in forming the underlying TFT backplanes in these devices limit display size variation and cost reduction. As will be described below, the use of novel SWCNT materials and manufacturing combinations, such as highly transparent porous conductive SWCNT electrodes enable the formation of SWCNT TFTs that can be incorporated into manufacturing lines for TFT backplanes that overcome the limitations in display backplanes fabricated with amorphous/crystalline/poly silicon, metal oxides and organic materials, and will be suitable for various needs.

Accordingly, various embodiments are directed to methods of integrating printed SWCNT technologies into a-Si TFT-LCD manufacturing line. Using such SWCNT backplanes the higher mobility enables LTPS TFT backplanes to have higher pixel density, lower power consumption, and integration with driving circuits on the glass substrate.

Embodiments Implementing SWCNT Selection/Purification Techniques

Figure 1B:
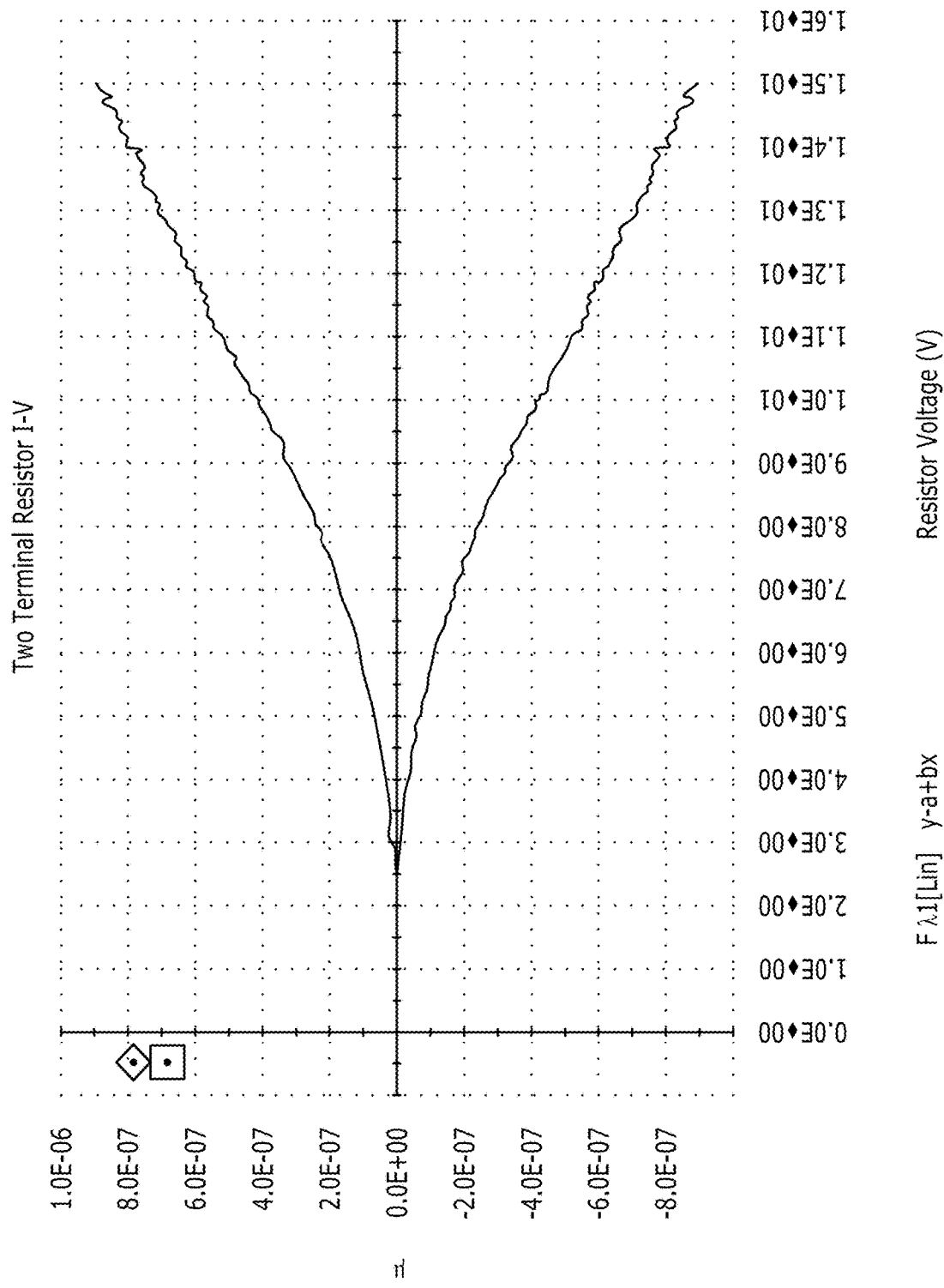

With the advent of separation technology, the ultra-pure single-walled carbon nanotubes with >95% purity can be produced and scaled up for large quantity manipulation. Using these processes high purity single chirality SWCNT with a wide variety of indexes may be produced. In many embodiments, high purity single chirality SWCNTs and mixtures incorporating SWCNTs with indexes of (6,4), (9,1), (8,3), (6,5), (7,3), (7,5), (10,2), (8,4), (7,6), (9,2) are formed. The NIR-Vis absorption spectrum of (6.5) SWCNTs is presented in FIG. 1a to show dominant S11 and S22 peaks at 978 nm and 562 nm. Their electrical property is characterized to be characteristics of pure semiconductor with negligible off-current (the I-V curve is provided in FIG. 1b). Accordingly, using such techniques it is possible to ensure the purity of these materials via conventional spectroscopy, and determine their electrical properties for selection.

TFT Backplane Manufacturing

Figure 2B:
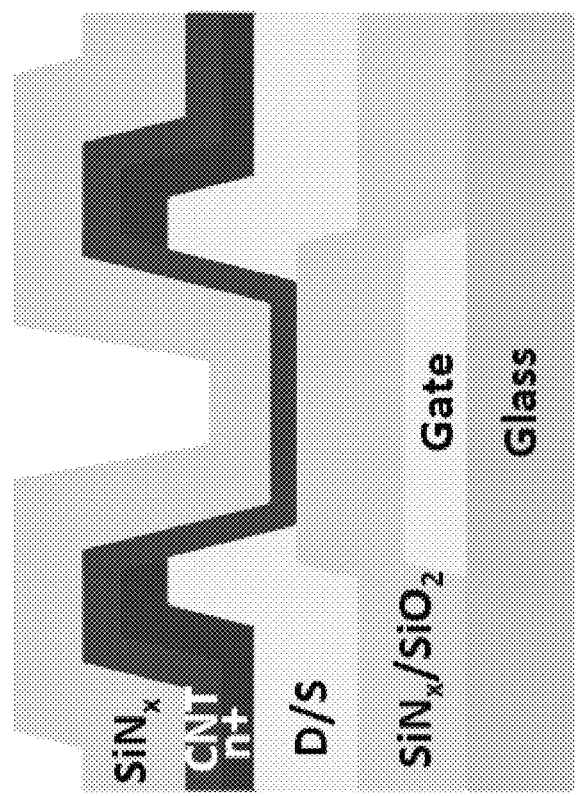
FIGS. 2a and 2b provide schematic illustrations of exemplary vertical light emitting transistors in accordance with embodiments of the invention.
Figure 2A:
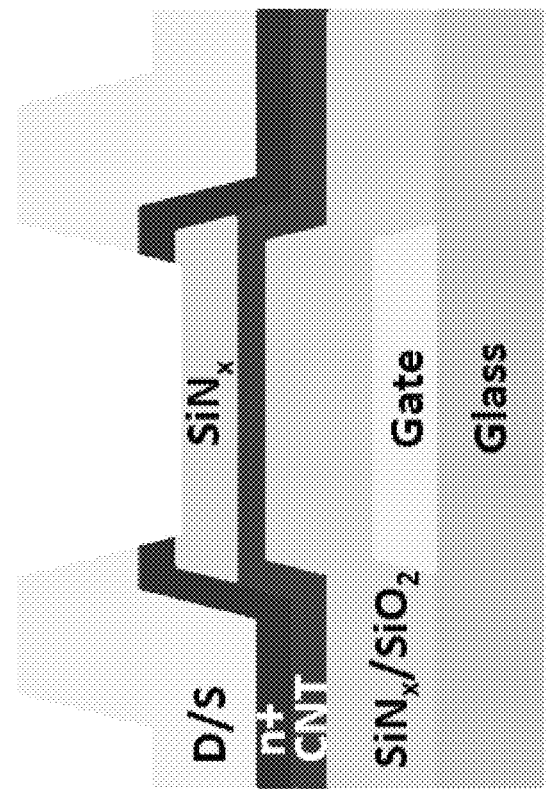

Embodiments are directed to methods and processes for employing ultra-pure semiconducting single-walled carbon nanotubes to replace amorphous silicon layer in industrial TFT backplane manufacturing lines. In particular, as shown in FIGS. 2a and 2b, layers of CNTs in accordance with embodiments may be implemented in bottom gated etch-stop CNT TFTs (e.g., FIG. 2a), and bottom gated back-channel etch CNT TFTs (e.g., FIG. 2b), among others. However, although the methods and processes will be described with reference to specific TFT backplane configurations, it will be understood that any TFT backplane design into which a CNT layer may be substituted for the silicon layer may be implemented in accordance with embodiments, including, for example, coplanar TFTs, short-channeled TFTs, staggered TFTs, planar TFTs and self-aligned TFTs.

Although many processes may be used to form such CNF TFTs, including specifically bottom gated etch-stop CNT TFTs, many such embodiments use a process as summarized in FIGS. 3a to 3k and described below. As shown, the method requires a number of process steps into which the CNT layers are integrated. These steps include:

The provision of a substrate and the formation atop the substrate of a patterned gate electrode (FIG. 3a).
The deposition of a gate electrode dielectric atop the gate electrode layer (FIG. 3b).
The deposition of a CNT thin film back-layer atop the dielectric layer (FIG. 3c).
The deposition of a CNT protection layer atop the CNT thin film back-layer (FIG. 3d).
The patterning of the CNT protection layer to expose the portion of the CNT back-layer above the gate electrode, leaving at least the edges with the CNT thin film covered by the CNT protection layer (FIG. 3e).
The deposition of an etch stopper dielectric layer atop the exposed portion of the CNT thin film and remaining CNT protection layer (FIG. 3f).
The patterning and etching of the etch stopper dielectric layer to deposit a second dielectric layer selectively atop the portion of the CNT thin film above the gate electrode (FIG. 3g).
The removing of the remaining CNT protection layer to expose the CNT thin film on the edges of the gate electrode channel (FIG. 3h).
The deposition of an n+ doped layer atop the CNT thin film and the etch stop dielectric layer (FIG. 3i).
The deposition of the drain/source electrode layer atop the n+ doped layer (FIG. 3j).
The patterning and etching of the drain/source electrodes (FIG. 3k).

The processing of such an etch-stop (ES) CNT TFT requires a few additional deposition steps, however it can be advantageous in some respects because it has the etch-stop layer that protects the back-channel so the intrinsic layer can remain thin (e.g., less than ~200 nm). Despite the above description it will be understood that the CNT back-channel layers can also be combined with other structures and techniques, including, for example back-channel-etched (BCE) TFTs. An exemplary process for such a BCE TFT is provided in FIGS. 4a to 4f, and described below. These steps include:

The provision of a substrate and the formation atop the substrate of a patterned gate electrode (FIG. 4a).
The deposition of a gate electrode dielectric atop the gate electrode layer (FIG. 4b).
The deposition of both drain/source electrode and n+ doped layers atop the dielectric layer (FIG. 4c).
The patterning and etching of the drain/source electrodes and the n+ layer (FIG. 4d).
The deposition of a CNT thin film back-layer atop the n+ layer (FIG. 4e).
The deposition of a passivation layer atop the CNT thin film back-layer (FIG. 4f).

Although the above methods are described in FIGS. 3 and 4 with respect to specific deposition techniques, it should be understood that many alternative embodiments and techniques may be used in association with the CNT back-layers in accordance with embodiments.

For example, in some such embodiments, as shown in FIGS. 3a and 4a, a substrate is provided onto which a gate electrode is formed. Although the substrate in the figures is listed as being glass, it should be understood that any material having sufficient optical transmission (e.g., in many embodiments, on the order of 80% or greater), and capable of resisting degradation at industrial standard processing temperatures (e.g., 100° C. and higher) may be used. Exemplary substrate material may include glass, polyethylene terephthalate (PET), polyethesulphone (PES), palyarylate (PAR), and polycarbonate (PA), among others. Similarly, the gate electrode itself may be made of any suitable metal such as Cu, Al, Ag, Mo, Cr, Nd, Ni, Mn, Ti, Ta or W, or the alloy of two or more of these metals. The gate metal layer may be in a single layer structure or a multi-layer structure, and the multi-layer structure may be of, for example Cu\Mo, Ti\Cu\Ti, Mo\Al\Mo or etc. The thickness of the gate electrode may be any suitable size, such as from 10 nm to more than 100 µm, and in some embodiments around 400 nm, as shown in FIGS. 3a and 4a.

Likewise, although the process for depositing the gate electrode is listed as comprising the steps of sputtering and patterning, it should be understood that many suitable and standard industrial processes may be use to pattern and deposit gate electrodes atop the substrate. For example, sputtering (or physical vapor deposition) may include one or a combination of electronic, potential, etching and chemical sputtering, among others. Deposition techniques may alternatively include, for example, chemical (CVD), plasma-enhanced vapor deposition (PECVD), and/or thermal evaporation, etc.

Similarly, the patterning of the underlying gate electrode may incorporate any suitable photoengraving process, such as wet or dry etching, including the utilization of any suitable photoresist and etching chemicals. In many such embodiments the gate electrode layer may be coated with a layer of a suitable photoresist, the photoresist may then be exposed and developed by the mask plate to respectively form a photoresist unreserved area and a photoresist reserved area. In many such embodiments the photoresist reserved area corresponds to an area where the gate electrode is arranged, and the photoresist unreserved area corresponds to other areas. In such embodiments the gate metal layer of the photoresist unreserved area may be completely etched off by the etching process, and the remaining photoresist removed, so that the gate electrode is formed.

Once the gate electrode is formed, as shown in FIGS. 3b and 4b, a suitable dielectric layer is formed atop the substrate and gate electrode layer. Again, although a PECVD process and a SiN dielectric material is specified in the figures, it should be understood that any suitable dielectric material and deposition process may be incorporated with methods. For example, in many embodiments the dielectric layer may be made of inorganic and organic materials, an oxide, a nitride, or a nitrogen oxide, such as, for example, SiNx, SiOx, TaOx, AlOx, or Si(ON)x. Moreover, the dielectric layer may be in a single layer structure, a dual layer structure or a multi-layer structure. The thicknesses of such structures may be take any size suitable to provide the dielectric function. In addition, the dielectric layer may be formed atop the substrate and gate electrode by any suitable the filming process, including, for example, magnetron sputtering, thermal evaporation, CVD (remote plasma, photo catalytic, etc.), PECVD, spin coating, liquid phase growth, etc. In various such embodiments, as shown in FIGS. 3b and 4b, the CNT TFTs incorporate $SiN_x/SiO_2$ layers deposited via PECVD at thicknesses of around 200 nm. Finally, if necessary a variety of feedstock gas molecules may be made in association with such dielectric materials, including SiHx, $NH_x$, $N_2$, and hydrogen free radical and ions. Similar techniques and materials may be used for the other passivation layers, including those etch-stop layers formed in FIG. 3f and the passivation layer shown in FIG. 4f. In these steps the deposit temperatures and thicknesses of the passivation materials may be chosen as required.

Regardless of whether the TFT is an ES or BEC TFT, all TFTs also require the deposition of n+ and drain/source layers, as shown in FIGS. 3i & 3j, and 4c. Although the figures show that sputter deposition of an approximately 400 nm Mo drain/source layer, and PECVD deposition of a thin (~10 nm) n+ doped layer, it should be understood that any suitable combination of deposition techniques and materials may be utilized. For example, the drain/source electrode layer may be made of any suitable metal such as Cu, Al, Ag, Mo, Cr, Nd, Ni, Mn, Ti, Ta or W, or the alloy of two or more of these metals. The gate metal layer may be in a single layer structure or a multi-layer structure, and the multi-layer structure may be of, for example Cu\Mo, Ti\Cu\Ti, Mo\Al\Mo or etc. The thickness of the gate electrode may be similarly be of any suitable size, such as from 10 nm to more than 100 µm, and in some embodiments around 400 nm, as shown in the figures. Likewise, although the process for depositing the electrode is listed as comprising the steps of sputtering and patterning, it should be understood that many suitable and standard industrial processes may be use to pattern and deposit gate electrodes atop the substrate. For example, sputtering (or physical vapor deposition) may include one or a combination of electronic, potential, etching and chemical sputtering, among others. Deposition techniques may alternatively include, for example, chemical (CVD), plasma-enhanced vapor deposition (PECVD), and/or thermal evaporation, etc.

Similarly, any suitable n+ material may be incorporated into the TFTs in accordance with embodiments, include, for example, n+ doped amorphous Si, or other suitable semiconductors including arsenide and phosphides of gallium, and telluride and sulfides of cadmium. Likewise and suitable plasma and/or n-type doping materials may be used with such semiconductors, including, for example, phosphorous, arsenic, antimony, bismuth, lithium, beryllium, zinc, chromium, germanium, magnesium, tin, lithium, and sodium, for example. And, these materials may be deposited with any suitable deposition technique including, thermal, physical, plasma, and chemical vapor deposition techniques, as described above. Some suitable techniques include, for example, aerosol assisted CVD, direct liquid injection CVD, microwave plasma-assisted CVD, atomic layer CVD, combustion chemical vapor deposition, hot filament CVD, hybrid physical-chemical vapor deposition, rapid thermal CVD, vapor-phase epitaxy and photo-initiated CVD. Alternatively, atomic layer deposition might be substituted for CVD for the thinner and more precise layers.

A number of steps in such processes also require the patterning and etching of materials (see, e.g., 3e, 3h, 3k and 4d). In such processes any suitable patterning and etching technique may be incorporated with embodiments. In particular, many of the steps incorporate a patterning process by which a passivation layer is deposited and a pattern is formed through the passivation layer. Specifically, in many embodiments the passivation layer may be coated with a layer of any suitable photoresist. In such embodiments the photoresist may be exposed and developed by a mask plate to respectively form a photoresist unreserved area and a photoresist reserved area. For example, the photoresist of the unreserved area may correspond in various embodiments to an area where the via hole of the passivation layer is arranged.

Any suitable optical photolithographic technique may be used, including for example, immersion lithography, dual-tone resist and multiple patterning electron beam lithography, X-ray lithography, extreme ultraviolet lithography, ion projection lithography, extreme ultraviolet lithography, nanoimprint lithography, dip-pen nanolithography, chemical lithography, soft lithography and magneto lithography, among others.

Regardless of the specific techniques and light source used, such lithographic techniques generally incorporate several steps. In many embodiments, the layer to be patterned is first coated with a photoresist, such as by spin coating. In such techniques, a viscous, liquid solution of photoresist is dispensed onto the wafer, and the wafer is spun rapidly to produce a uniformly thick layer. The spin coating typically runs at 1200 to 4800 rpm for 30 to 60 seconds, and produces a layer between 0.5 and 2.5 micrometers thick. The spin coating process results in a uniform thin layer, usually with uniformity of within 5 to 10 nanometers, or more. In various embodiments, the photo resist-coated material may then be prebaked to drive off excess photoresist solvent, typically at 90 to 100° C. for 30 to 60 seconds on a hotplate. After the non masked portions of the layer are etched, either by a liquid ("wet") or plasma ("dry") chemical agent to remove the uppermost layer of the substrate in the areas that are not protected by photoresist. After a photoresist is no longer needed, it is then removed from the substrate. This photoresist may be removed chemically or by a plasma or by heating.

Although specific deposition and patterning methods are disclosed, as well as specific materials for substrates, electrodes, dielectrics, passivation layers, etc., and specific conditions, including, thicknesses, temperatures etc., it will be understood that any of these parameters may be adjusted as necessary for the specific TFT configuration and operational parameters without fundamentally altering the principles of embodiments that incorporate the CNTs disclosed herein.

Embodiments Implementing SWCNT Deposition Techniques

Turning to embodiments of methods for depositing the CNT layers in the TFTs, in many embodiments various techniques may be used, including various depositions and spraying methods.

Figure 5A:
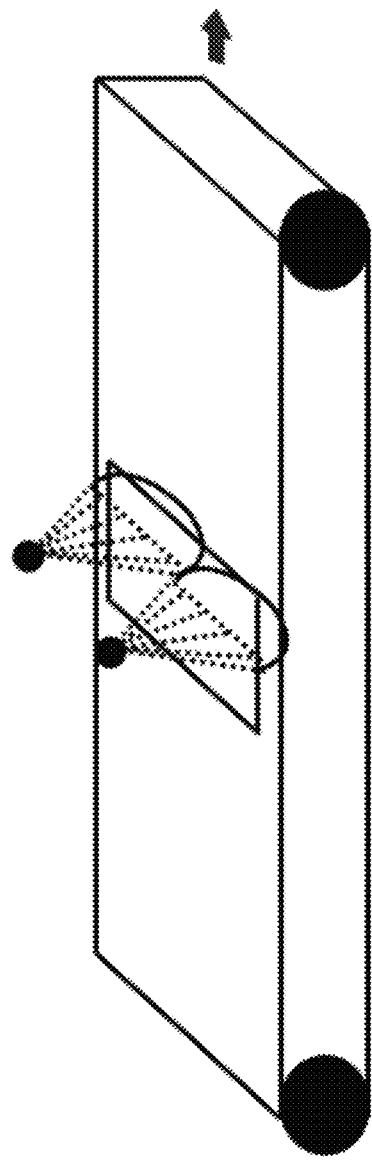
FIGS. 5a to 5c provide schematic illustrations showing: a) multiple spray heads for solution spraying devices in moving stations, b) an airbrush for ultrasonic spray, and c) aerosol spray system, each in accordance with embodiments of the invention.
Figure 5B:
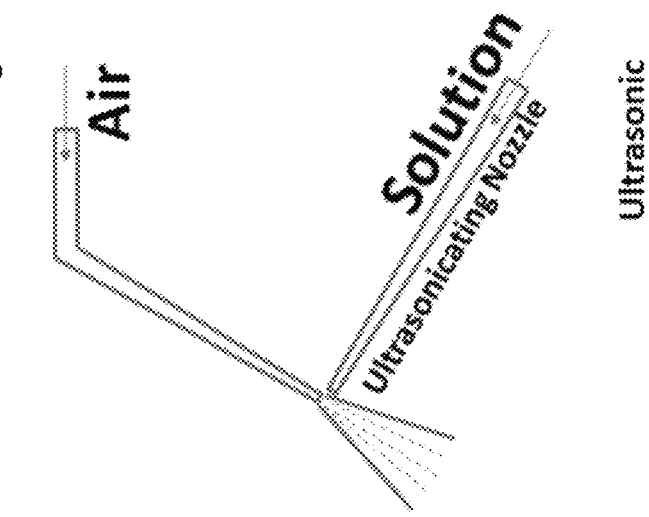
Figure 5C:
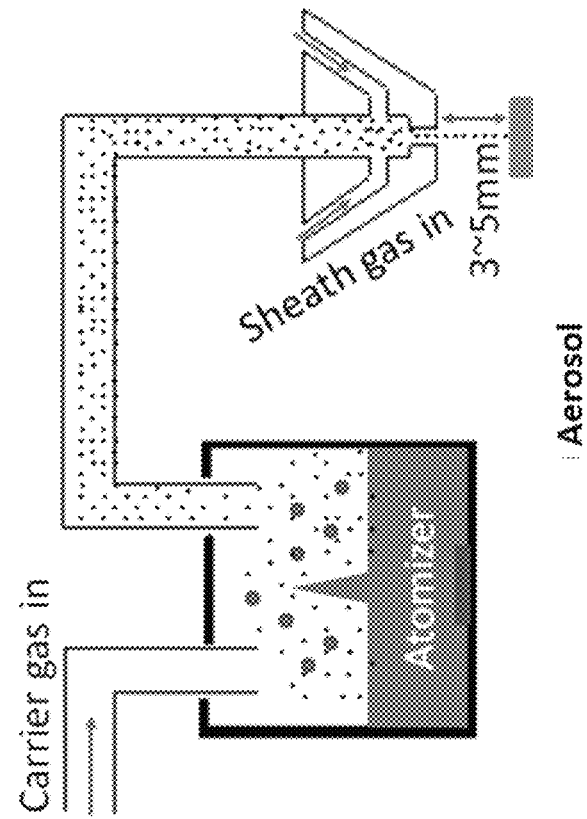

In many embodiments, single-walled carbon nanotube thin films are solution coated using a spraying technique, such as air, aerosol or ultrasonic spraying in association with a moving station manufacturing line, as described in relation to FIGS. 5a to 5c. As shown in FIG. 5a, in many embodiments a moving station is provided onto which substrates are loaded, and in association with a carbon nanotube solution may be sprayed (e.g., by aerosol or air spray coating) onto the substrates of a suitable size (e.g., 4"-100") while heating them at a desirable processing temperature (e.g., from 60-200° C., or any temperature that is allows by the underlying materials and the CNT materials themselves). In such embodiments, the moving speed of station may be controlled to keep the film thickness and uniformity (e.g., 1 mm/s-1000 mm/s).

In other embodiments, ultrasonic spray coating may be used. As shown in FIG. 5b, in such embodiments a stream of compressed air is passed through an aspirator, which creates a local reduction in air pressure that allows the carbon nanotube solution to be pulled out from a container at normal atmospheric pressure. During processing, the ultrasonicating nozzle atomizes the carbon nanotube solution into very tiny droplets of, for example, anywhere from a few µm to around 1000 µm in diameter. The tiny droplets are then deposited onto substrates at a suitable processing temperature (e.g., up to 400° C.), such that the droplets are immediately dried to mitigate the O-ring aggregations. In various embodiments, a temperature of 100° C. may be used. Although any suitable air pressure may be used (dependent on the viscosity of the material, in many embodiments the compressed air pressure can be ranged from 20 psi (1.38 bar) to 100 psi (6.8 bar) dependent upon the solution viscosity and the size of aspirator required for the deposition.

In embodiments incorporating aerosol spray coating (as shown in FIG. 5c), the carbon nanotube solution may be atomized using high pressure gas (e.g., 200-1000 standard cubic centimeter per minute (sccm)), or ultra-sonication (e.g., 20 V-48 V, 10-100 Watts) to produce 1-5 micron aerosols that are brought to spray head by carrier gas (e.g., 10-30 sccm). It should be understood that these processing parameters are only exemplary and that other deposition properties may be used dependent on the type of material, the nature of aerosols desired and the thickness of the coatings to be formed.

Figure 7:
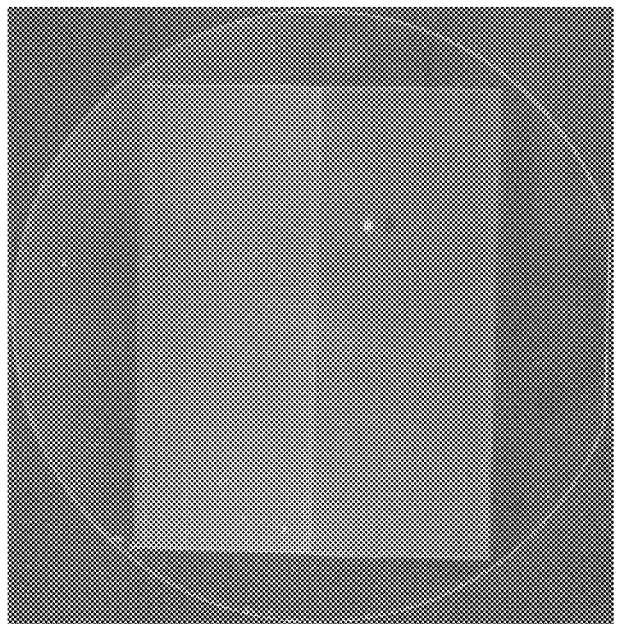
FIG. 7 provides an image of an aerosol sprayed carbon nanotube thin film in accordance with embodiments of the invention.
Figure 6:
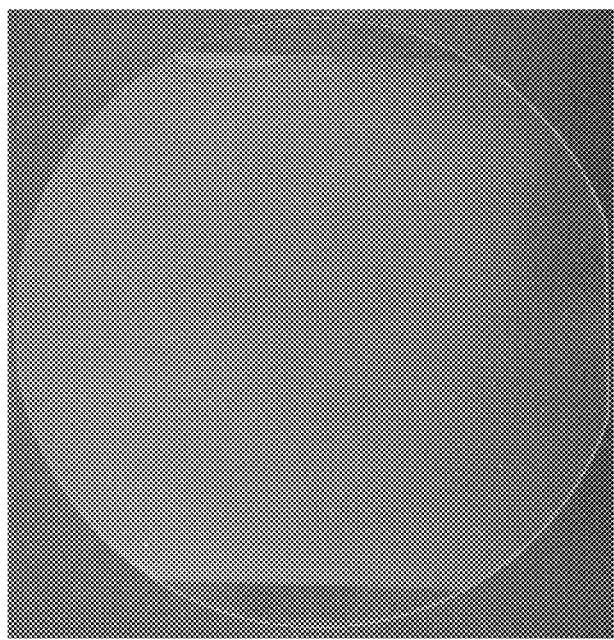
FIG. 6 provides an image of an airbrush sprayed carbon nanotube thin film in accordance with embodiments of the invention.
Figure 8:
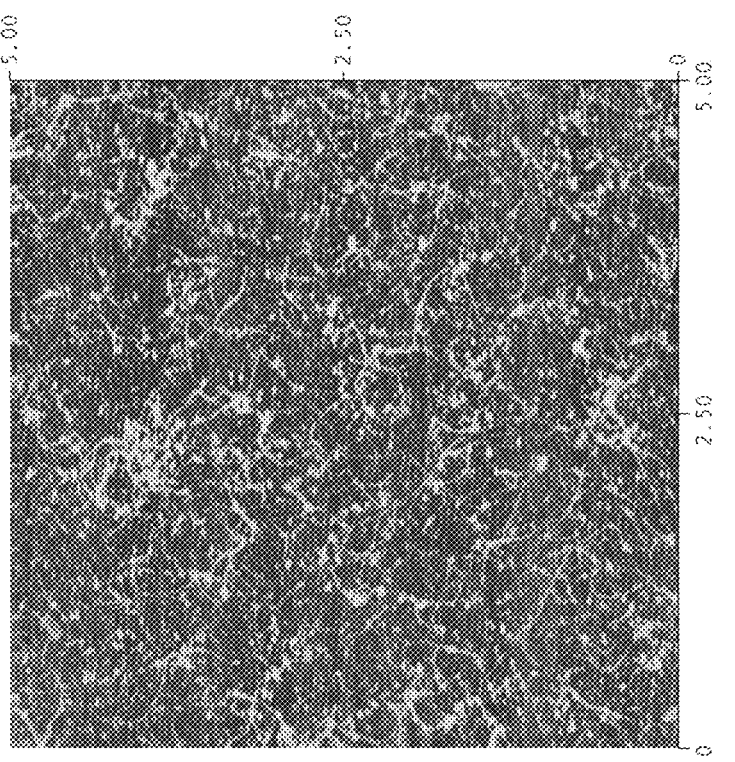
FIG. 8 is an atomic force microscope (AFM) image of an airbrush sprayed single-walled carbon nanotube thin film in accordance with embodiments of the invention.
Figure 9:
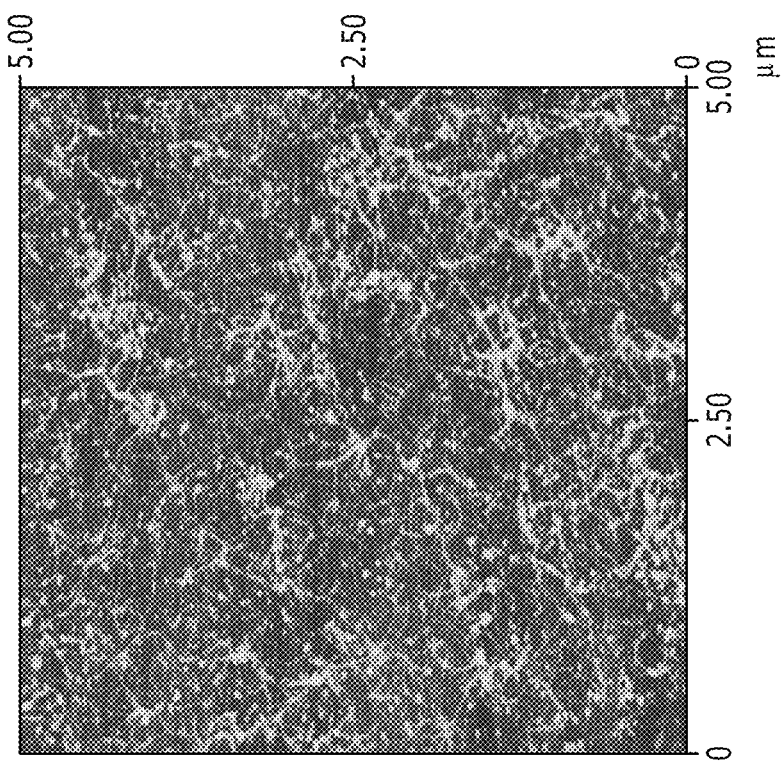
FIG. 9 is an atomic force microscope (AFM) image of an aerosol sprayed single-walled carbon nanotube thin film in accordance with embodiments of the invention.

FIGS. 6 and 7 shown images of thin films of SWCNT spray coated onto substrates using an airbrush technique (FIG. 6) and using an aerosol technique (FIG. 7), according to embodiments. In many embodiments, thus formed carbon nanotube thin films are treated by acetic acid gas generated by airbrush spray or aerosol spray and then washed with isopropanol to achieve clear carbon nanotube surfaces. The clear carbon nanotube surfaces are characterized with atomic force microscope (AFM). These samples could not be characterized on glass substrate using scanning electron microscope due to the highly insulation of such substrates. As shown, FIG. 8 provides an AFM image of airbrush sprayed SWCNT thin film, and FIG. 9 provides an AFM image of aerosol sprayed SWCNT thin film. This imagery provides proof of the robust nature of the deposition process, and the ability to depose high quality thin film coatings of SWCNT.

In embodiments, carbon nanotube thin films formed in accordance with such spray coating processes are used to replace amorphous silicon in 4-photomask photolithography processes to pattern drain/source electrodes, dielectrics, top-gated electrodes, and pixel electrodes following industry manufacturing standard methods, as described above with respect to FIGS. 3 and 4.

Figure 10:
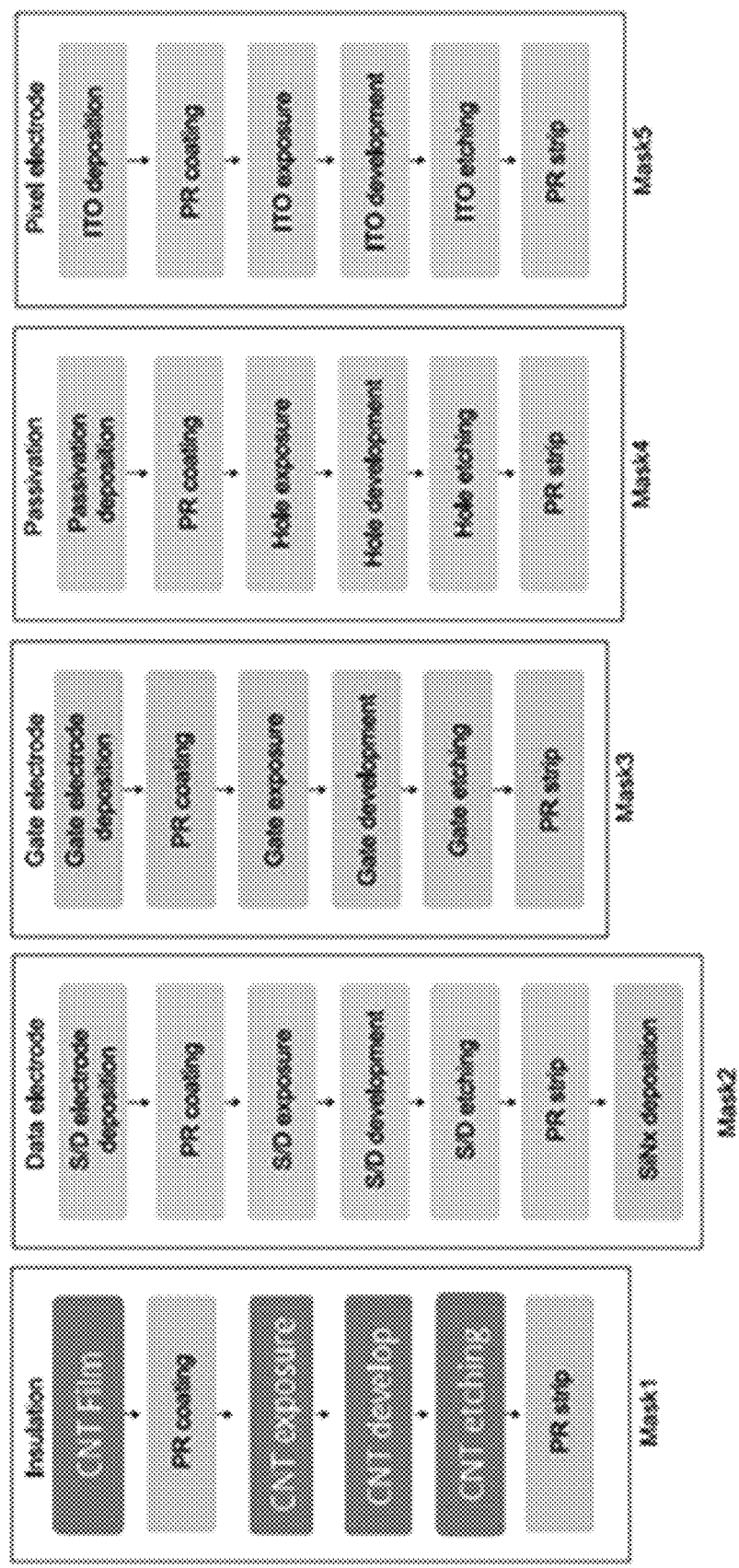
FIG. 10 provides a flowchart showing a fabrication process for manufacturing top-gated carbon nanotube TFT backplanes in accordance with embodiments of the invention.

Although the embodiments shown in FIGS. 3 and 4 are shown as extending beyond the channel, in order to reduce the subthreshold current leakage, other embodiments may employ at least one additional photomask to pattern the active carbon nanotube thin layer using photolithography. In such embodiments, the CNT layer outside of the transistor channels may be removed by a suitable etching technique, such as, for example, $O_2$ plasma or wet etching. In various such embodiments, the clear uniform carbon nanotube thin film may be photoresist (PR) coated and photo exposed, and then solution developed. On these developed areas, the carbon nanotube thin film is etched using, for example, $O_2$ plasma or a wet chemical etching, such as a buffered HF solution. The undeveloped PR is then stripped off to leave a patterned carbon nanotube thin film. A flow-chart providing one embodiment of such a method is provided in FIG. 10. It should be understood that any of the steps and techniques listed in the flow-chart may be substituted with alternatives as described in detail above.

Figure 11:
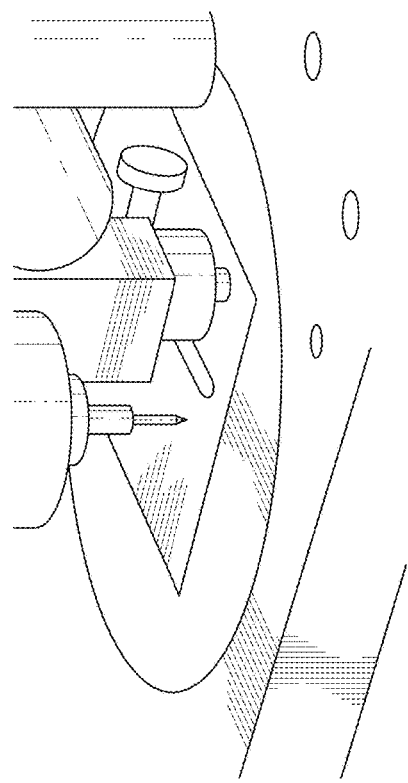
FIG. 11 provides an image of an aerosol printer for printing carbon nanotube patters on drain/source marks in accordance with embodiments of the invention.
Figure 12:
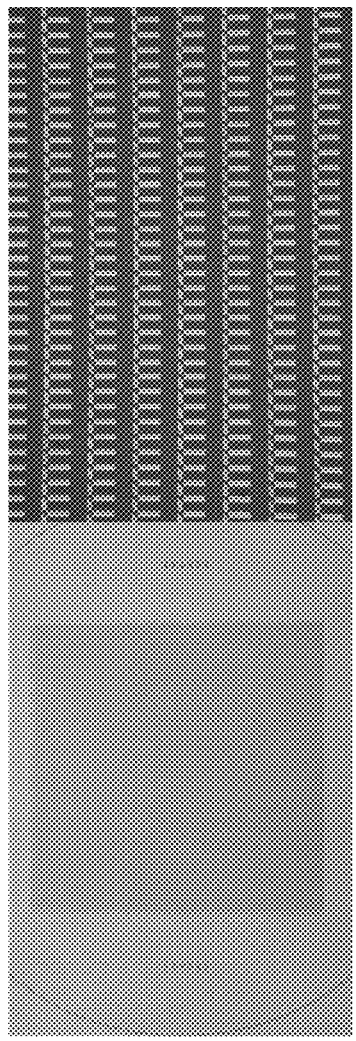
FIG. 12 provides a photo and optic image of drain/source marks before aerosol printing single-walled carbon nanotube patterned films in accordance with embodiments of the invention.
Figure 13:
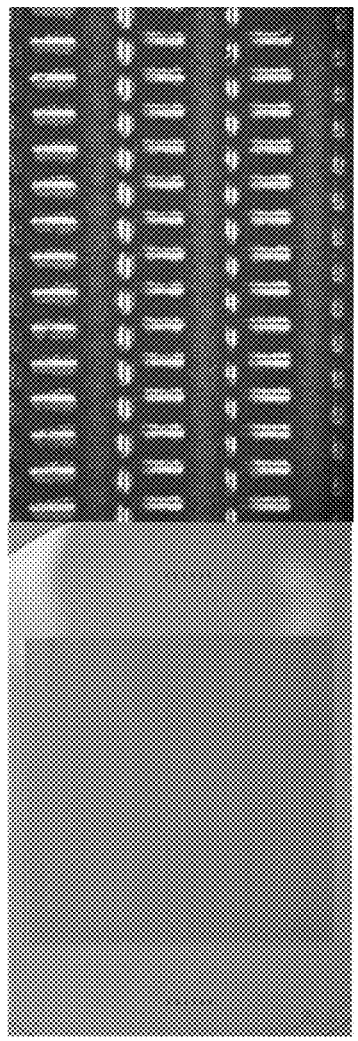
FIG. 13 provides a photo and optic image of aerosol printed single-walled carbon nanotube patterned films on drain/source marks in accordance with embodiments of the invention.
Figure 14:
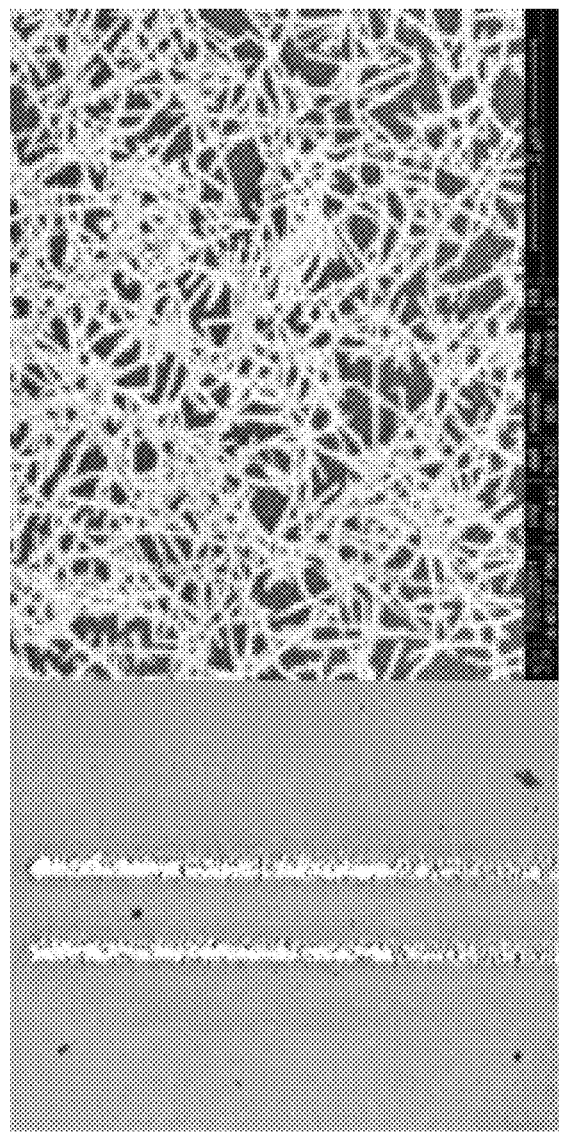
FIG. 14 provides an optic image of aerosol jet printed carbon nanotube films, and where the inset is an SEM image, in accordance with embodiments of the invention.
Figure 15C:
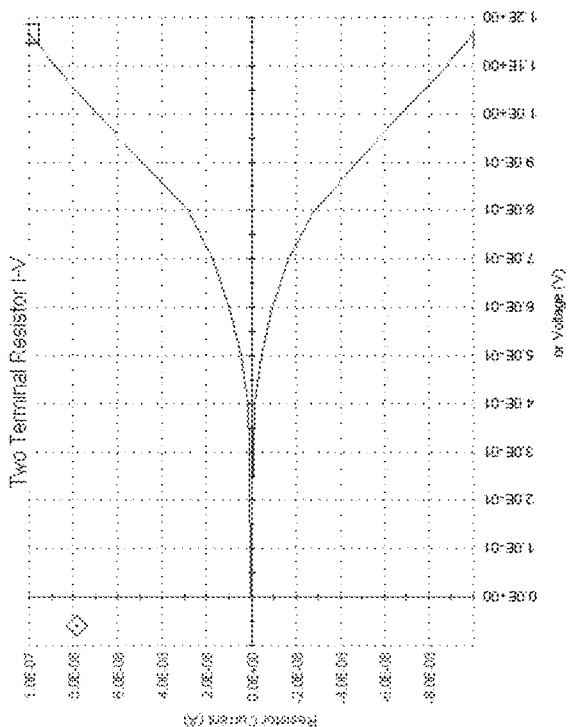
FIG. 15a provides an optic image of aerosol jet printed carbon nanotube films on photolithography patterned electrodes, and where the FIGS. 15b and 15c are I-V curves of such carbon nanotube films showing pure semiconductor properties, in accordance with embodiments of the invention.
Figure 15B:
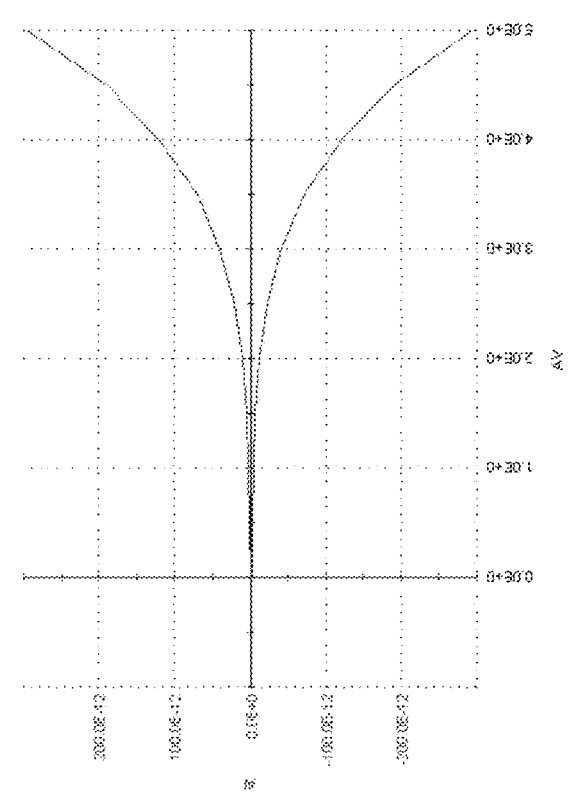
Figure 15A:
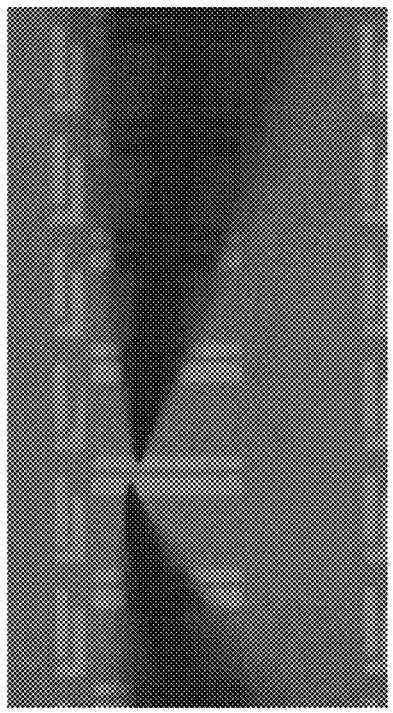

In still other embodiments, to reduce the use of an extra photomask to pattern active carbon nanotubes and to reduce the consumption of the carbon nanotube solution, the SWCNT thin films may be printed atop the substrate. In many such embodiments, an aerosol jet printer may be used to print the active carbon nanotube thin film using small nozzle size (e.g., <100 µm). An aerosol jet printer can deposit <10 µm linewidth with <2 µm registration accuracy. To do so, the aerosol jet printer prints carbon nanotubes on patterned drain/source marks. An image of such an aerosol printing set-up is provided in FIG. 11. FIG. 12 shows photo and optic images of exemplary drain/source marks before printing SWCNT films. FIG. 13 provides photo image and optic images of printed SWCNT thin film on drain/source marks. As described above, aerosol jet printed carbon nanotubes can be treated with aerosol sprayed or airbrush sprayed acetic acid gas, and followed by isopropanol washing. These clear carbon nanotube thin films can then be characterized with SEM. The SEM image (FIG. 14) displays clear carbon nanotube films on drain/source markers, in accordance with embodiments. The clear carbon nanotube films have been characterized with a Keithly 4200 semiconductor characterization system to show semiconducting properties, as shown in FIGS. 15a-15c.

Figure 16:
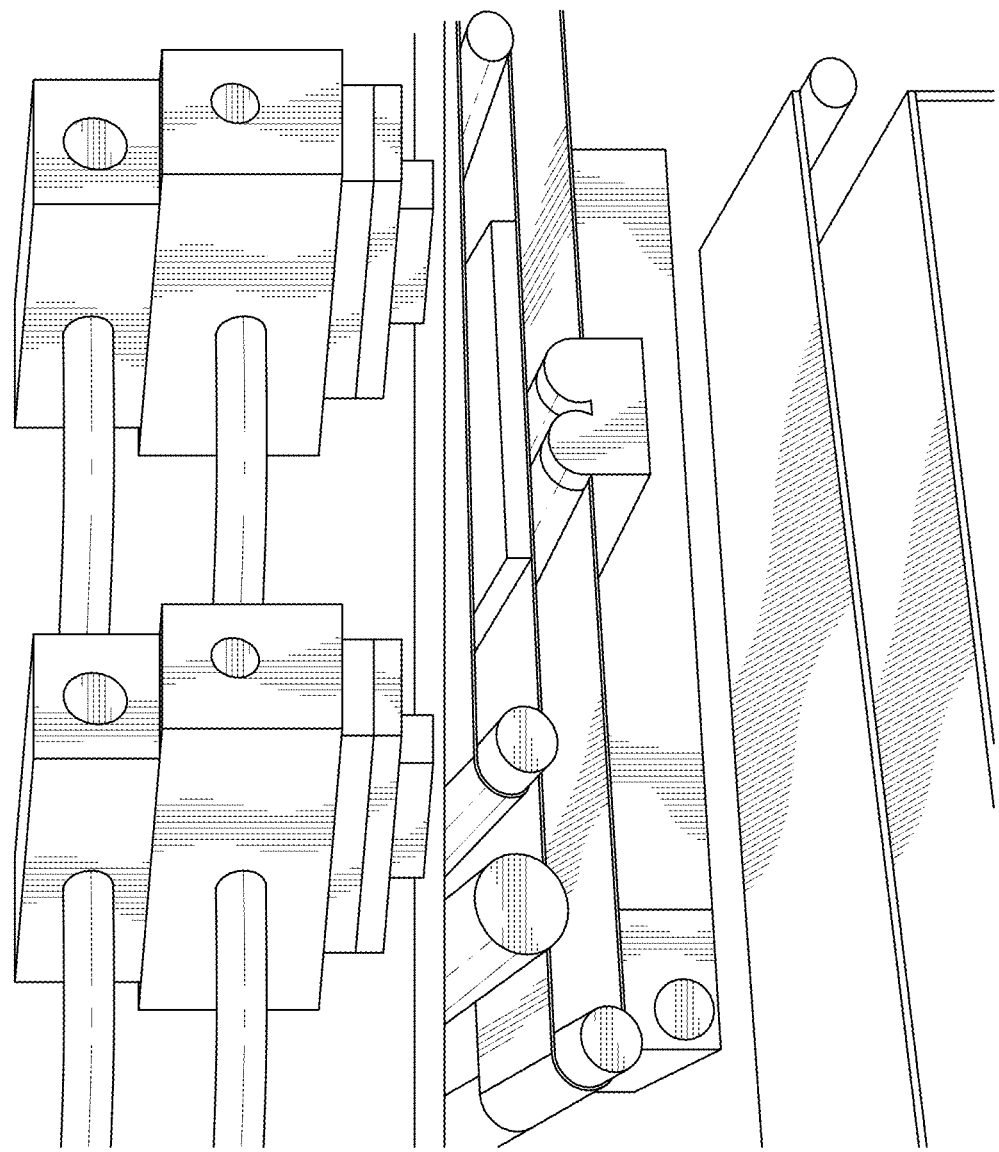
FIG. 16 provides a photo image of an apparatus having multiple aerosol jet printer heads mounted on a roll-to-roll station in accordance with embodiments of the invention.

To further take advantage of low-cost, low environmental impact and large area fabrication due to the small number of process steps, limited amount of material and high throughput, embodiments propose to aerosol jet printing methods described above (including its high precision: registration accuracy of 1-2 µm) with a roll-to-roll system with high speed process. With such a roll-to-roll aerosol jet printer, SWCNT ink can be printed in a rapid way for mass production in a-Si TFT backplane manufacturing line. Also, fully printed SWCNT TFT backplanes can be fabricated massively using roll-to-roll system. To match up with industry speed, embodiments disclose multiple aerosol jet printer heads mounted on moving station, such as shown in FIG. 16, may be used for high speed printing carbon nanotube thin films. On a moving station, such multiple aerosol jet printer heads can print a large number of carbon nanotube patterns.

Exemplary Embodiments

Additional embodiments and features have been set forth in part in the exemplary embodiments below, and in part will become apparent to those skilled in the art upon examination of the specification or may be learned by the practice of the invention. None of the specific embodiments are proposed to limit the scope of the remaining portions of the specification and the drawings, and they are provided as exemplary of the devices, methods and materials disclosed herein. In particular, although specific structures and particular combinations of materials are recited, it should be understood that these are merely provided as examples, and any suitable alternative architectures and materials may be substituted.

EXAMPLE 1

Comparison of Conventional a-Si TFT and CNT TFT Techniques

Figure 17:
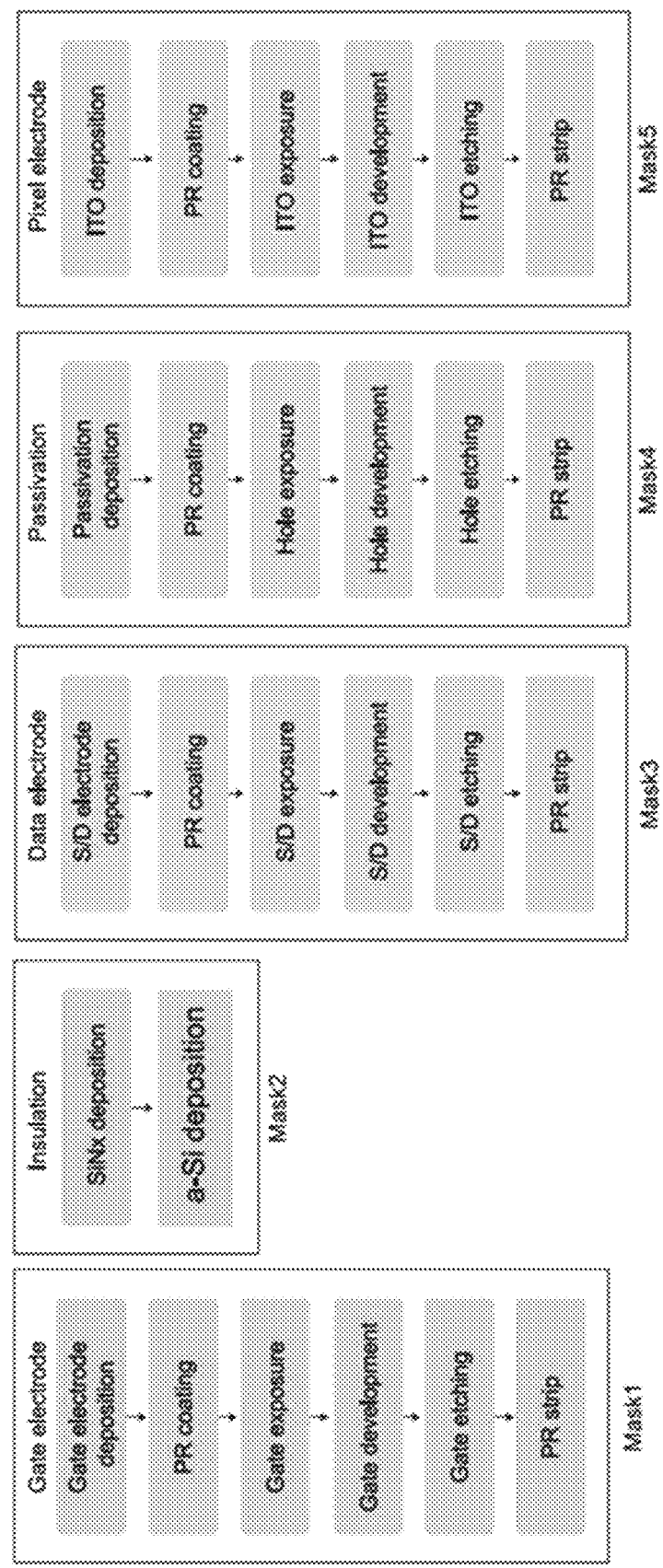
FIG. 17 provides a flowchart showing a fabrication process for manufacturing a standard bottom-gated a-Si TFT backplane in accordance with the prior art.
Figure 18:
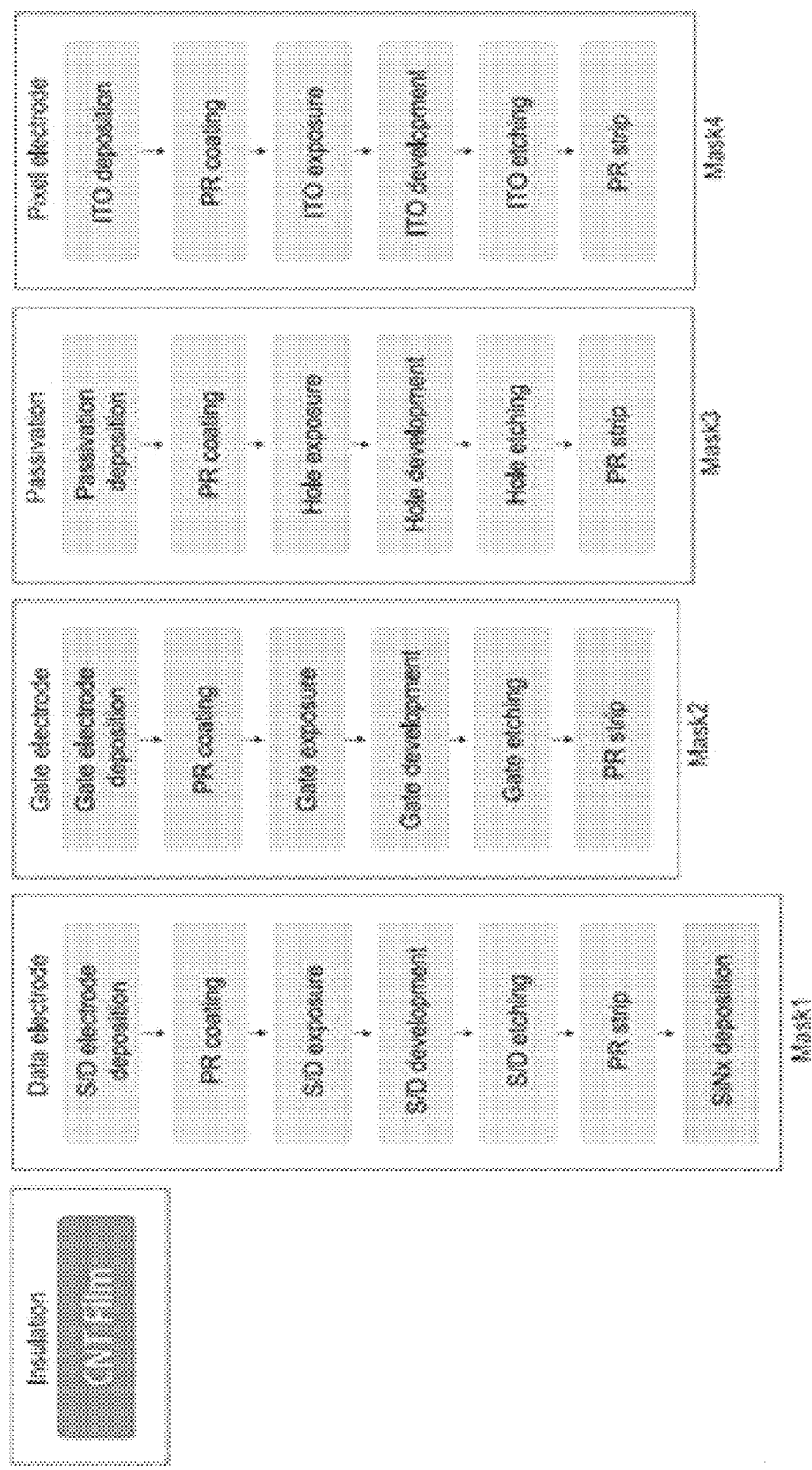
FIG. 18 provides a flowchart showing a fabrication process for manufacturing top-gated carbon nanotube TFT backplanes in accordance with embodiments of the invention.
Figure 19:
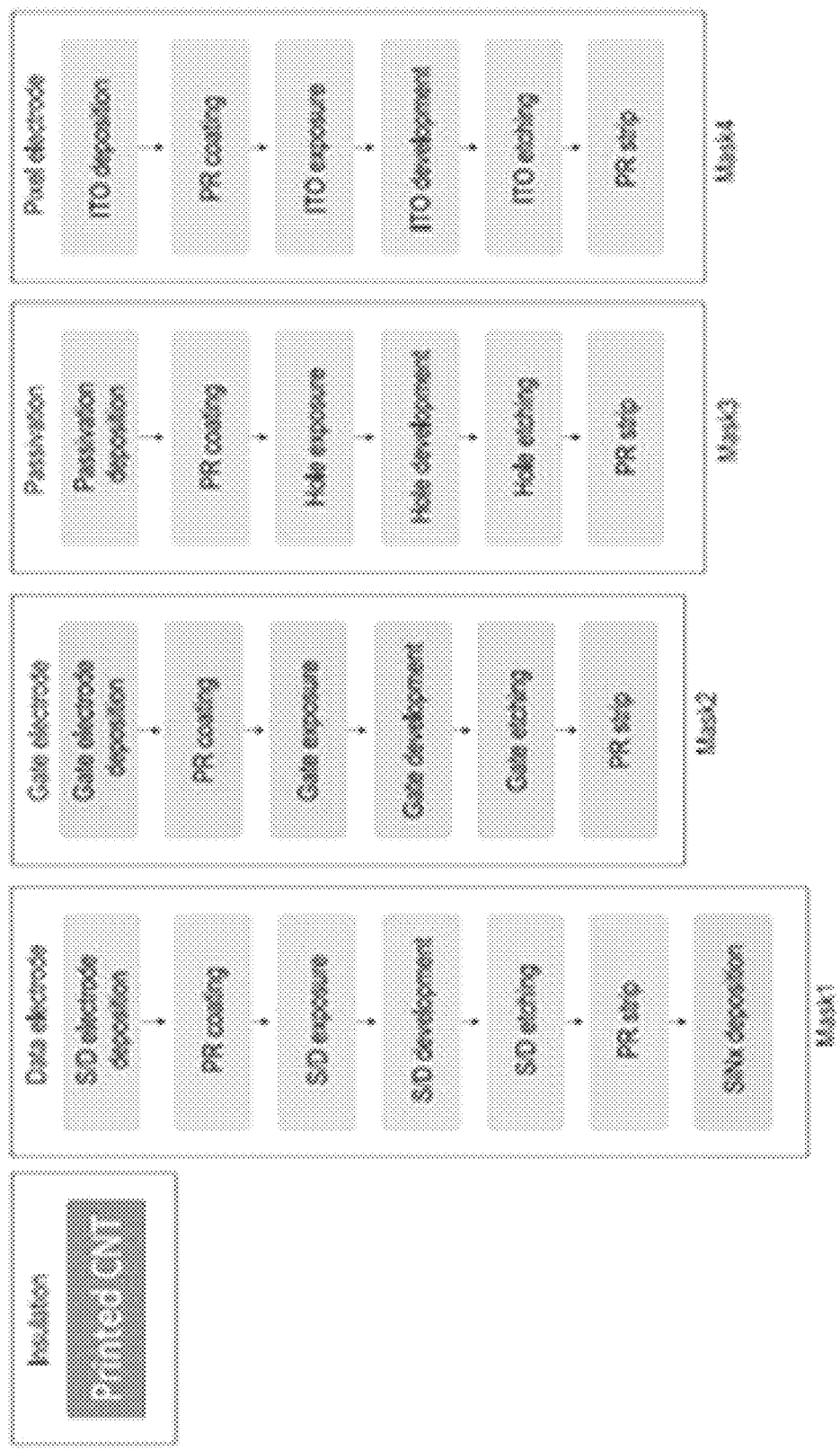
FIG. 19 provides a flowchart showing a fabrication process for manufacturing a top-gated printed carbon nanotube TFT backplanes in accordance with embodiments of the invention.

A flow-chart for an exemplary method for manufacturing an amorphous silicon TFT backplane on manufacturing lines is provided in FIG. 17. As shown in this method amorphous Si is deposited over large areas by plasma enhanced chemical vapor deposition, and then other devices are fabricated following other conventional manufacturing steps. In embodiments the amorphous silicon may be replaced by CNTs. Such CNT films may be deposited and/or printed in accordance with techniques previously described. Using such clear carbon nanotube thin films according to embodiments, standard industry manufacturing methods may be used to further pattern drain/source electrodes, dielectrics, top-gated electrodes and pixel electrodes as described in FIGS. 18 and/or 19.

EXAMPLE 2

SWCNT TFTs

Figure 20:
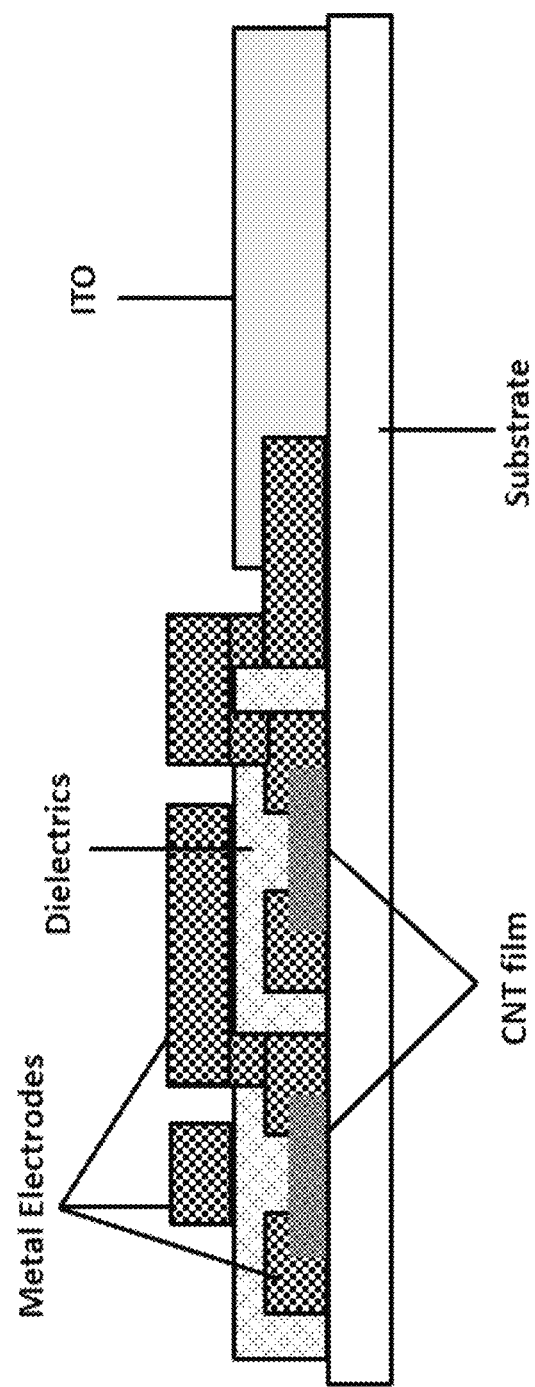
FIG. 20 provides a cross-sectional view of a single-walled carbon nanotube thin film transistor in accordance with embodiments of the invention.

Using the techniques described above it is possible to formed single-walled carbon nanotube thin film transistor, as shown, for example, in FIG. 20.

EXAMPLE 3

Displays

Finally, although the above exemplary embodiments and discussion have focused on methods, architectures and structures for individual devices and backplanes, it will be understood that the same architectures and structures may be combined as pixels into a display device. In such an embodiment, a plurality of SWCNT TFTs as described herein may be combined and interconnected as is well-known by those skilled in the art, such as by electronically coupling the devices into addressing electrode lines, to form a TFT-backplane for a display, such as an AMOLED display.

EXAMPLE 4

Industrially Robust Carbon Nanotube TFTs

Results of studies on exemplary embodiments of systems and methods for the industrial manufacturing of carbon nanotube thin film transistors and products formed from such systems and methods are provided. These embodiments demonstrate that such systems and methods produce carbon nanotubes at 1100° C. and 10 atmosphere pressure. Various such carbon nanotube embodiments are capable of withstanding sputter processes, distinguishing them from conventional chemical vapor deposited carbon nanotubes. Embodiments demonstrate that that electronically pure semiconducting carbon nanotubes produced according to embodiments can be configured to fully replace amorphous silicon for display backplanes.

In contrast to current a-Si, LTPS and oxide TFTs, electronically pure SWCNT TFTs exhibit equivalent or better figures of merit for a number of important characteristics, including, high field effect mobility, low temperature fabrication, good stability, uniformity, scalability, flexibility, transparency, mechanical deformability, low voltage and low power, bendability and low cost. Recently, Hennrich et al. reported aligned semiconducting carbon nanotube transistors exhibited a hole mobility of about 300 $cm^2$/Vs and 108 ON/OFF ratio. (See, e.g., F. Hennrich, et al., *ACS Nano*, vol. 10, pp. 1888-1895, 2016, the disclosure of which is incorporated herein by reference.) Meanwhile, Bao's group at Stanford demonstrated stretchable carbon nanotube transistors characteristics of 15 $cm^2$/Vs and ~103 ON/OFF ratio based on elastomer substrate and elastomer dielectrics. (See, e.g., A. Chortos, et al., *ACS Nano*, vol. 11, pp. 7925-7937, 2017, the disclosure of which is incorporated herein by reference.) Despite the potential promise of these materials, industrial concerns exist about the adoptability of current bench mark manufacturing lines for the fabrication of carbon nanotube thin film transistors. Embodiments herein are directed to systems and methods for the production of carbon nanotube thin film transistors under stringent industrial conditions. Carbon nanotube thin film transistors according to embodiments realize: cost saving, improved quality, a capability to implement flexible and wearable displays, and capability to replace current amorphous silicon backplanes.

Although many methods for each of these processes are known in the art, it has been determined that forming carbon nanotube thin films capable of being integrated into thin film transistors under standard industrial conditions requires a set of particular processes and conditions. Specifically, in order for carbon nanotube thin film transistors to be produced and integrated into an industrial manufacturing line according to embodiments several key points need to be considered: 1) the adhesion of carbon nanotube thin films to the substrates; 2) the fidelity of the solution process on large size substrates up to Gen10.5 line using carbon nanotube aqueous ink; 3) the industrial wet etch conditions necessary to prevent damage to the carbon nanotube thin films; and 4) the PECVD growth conditions necessary to integrated carbon nanotube thin films within the overall thin film transistor devices. Using embodiments of methods and processes as described herein carbon nanotube thin films are demonstrated capable of forming thin film transistors robust to industrial conditions.

Figure 21A:
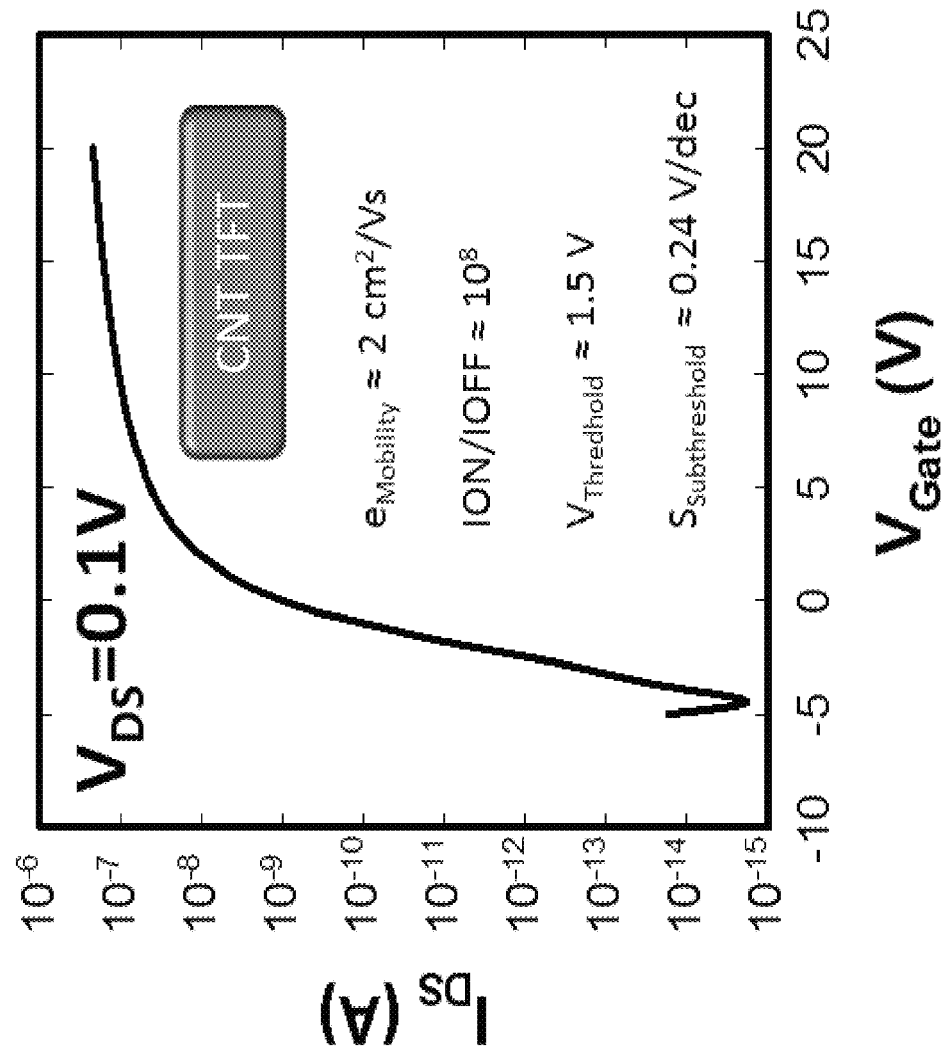
FIGS. 21a to 21c provide data graphs illustrating transfer characteristic comparisons of: (a carbon nanotube thin film transistors according to embodiments; (b traditional amorphous silicon thin film transistors; and (c metal oxide thin film transistors.
Figure 21B:
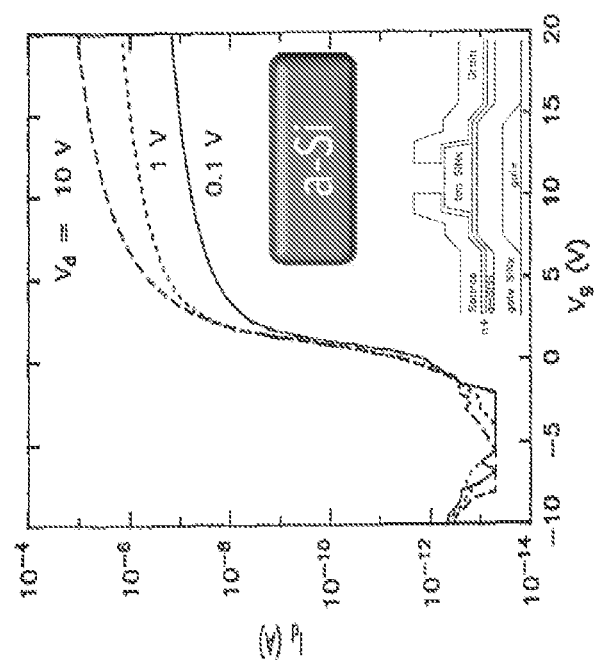
Figure 21C:
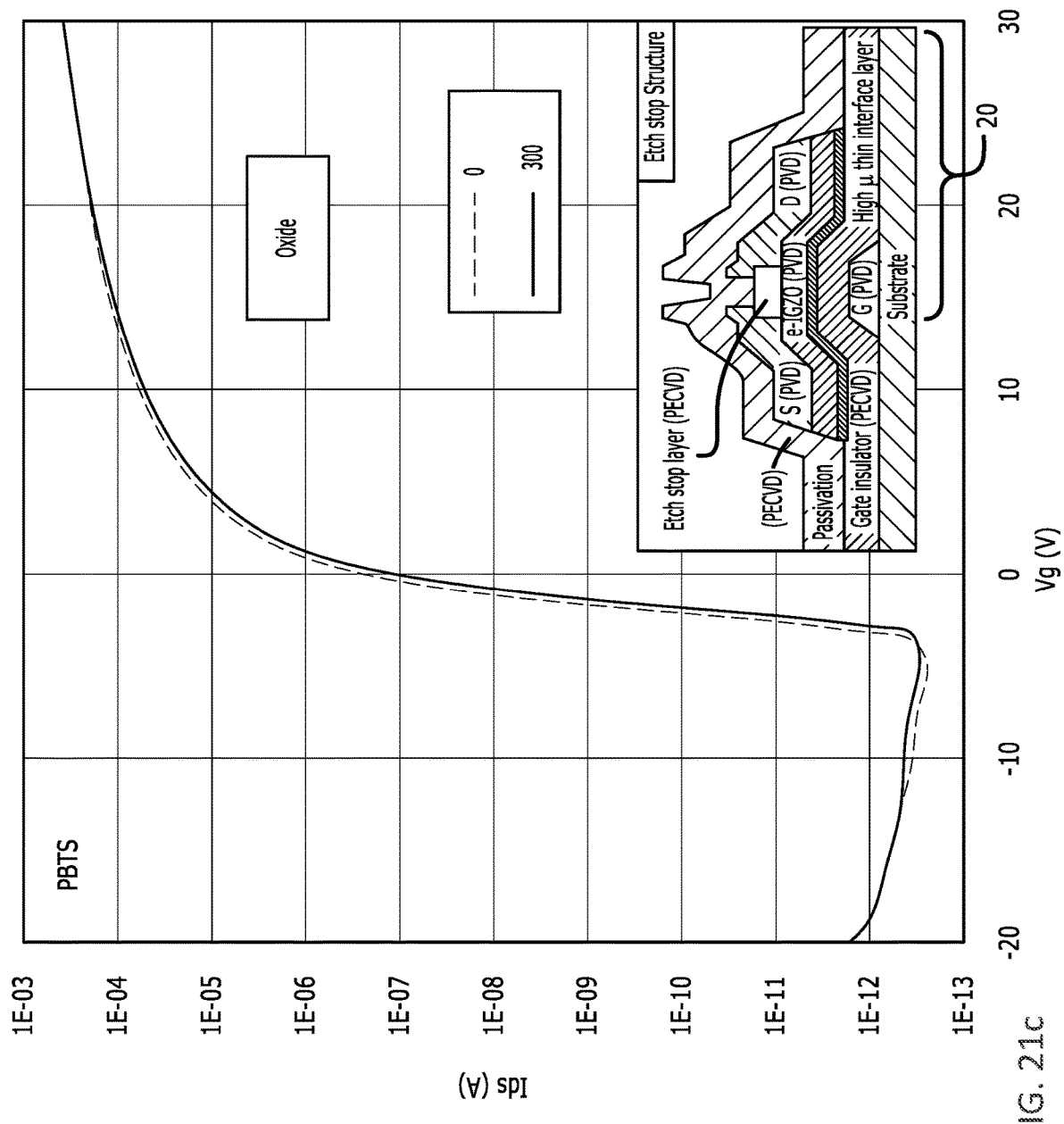
Figure 22A:
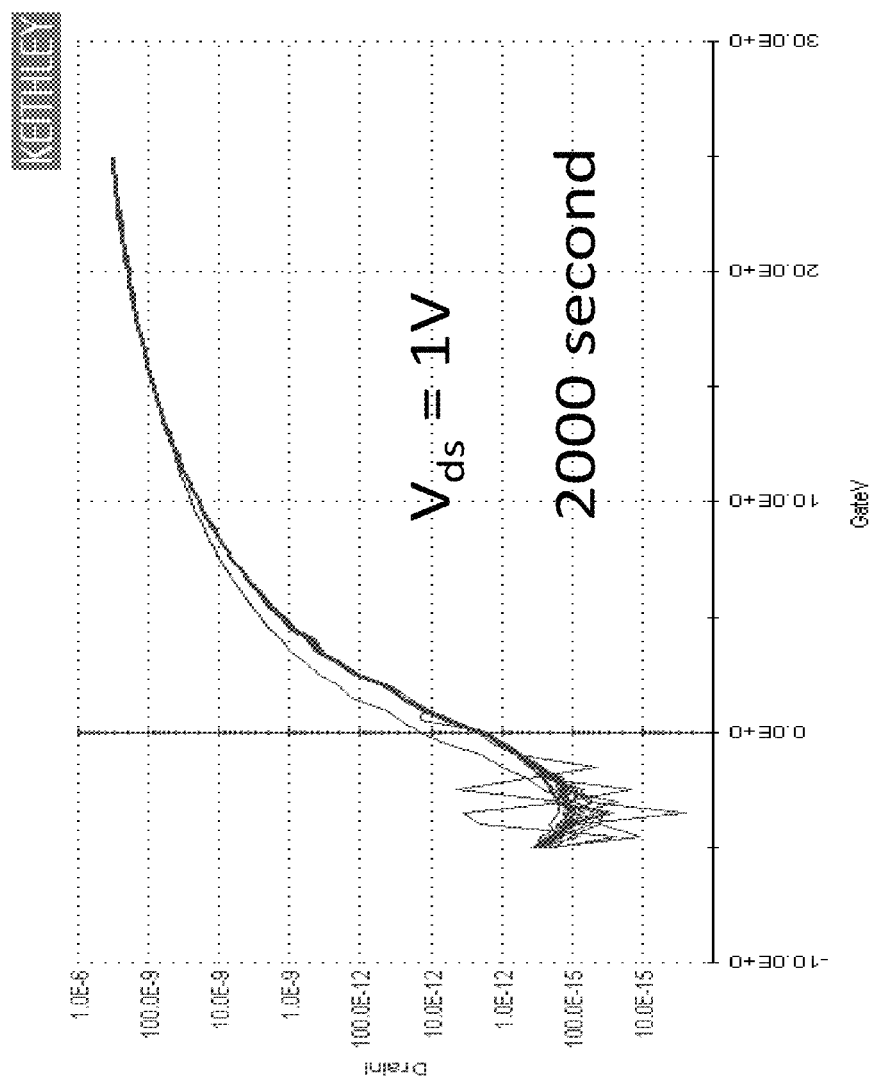
FIGS. 22a to 22c provide transfer curves of CNT TFTs according to embodiments after: (a 2000 seconds stress under 10 V gate; (b temperature stability; and (c photostability.
Figure 22B:
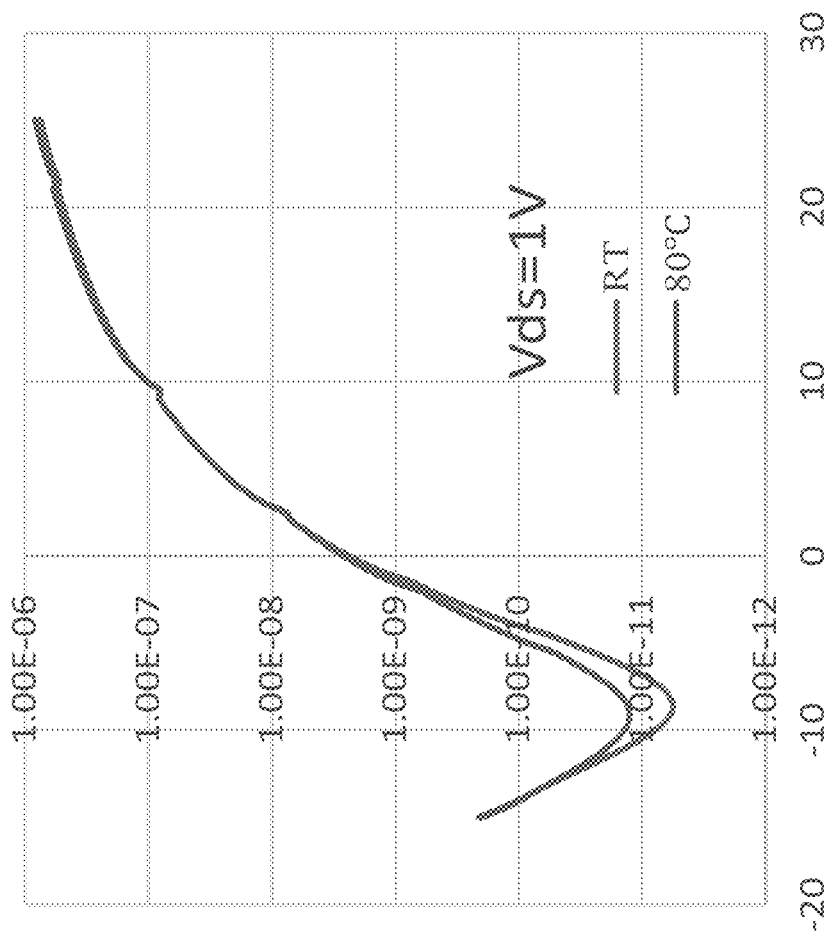
Figure 22C:
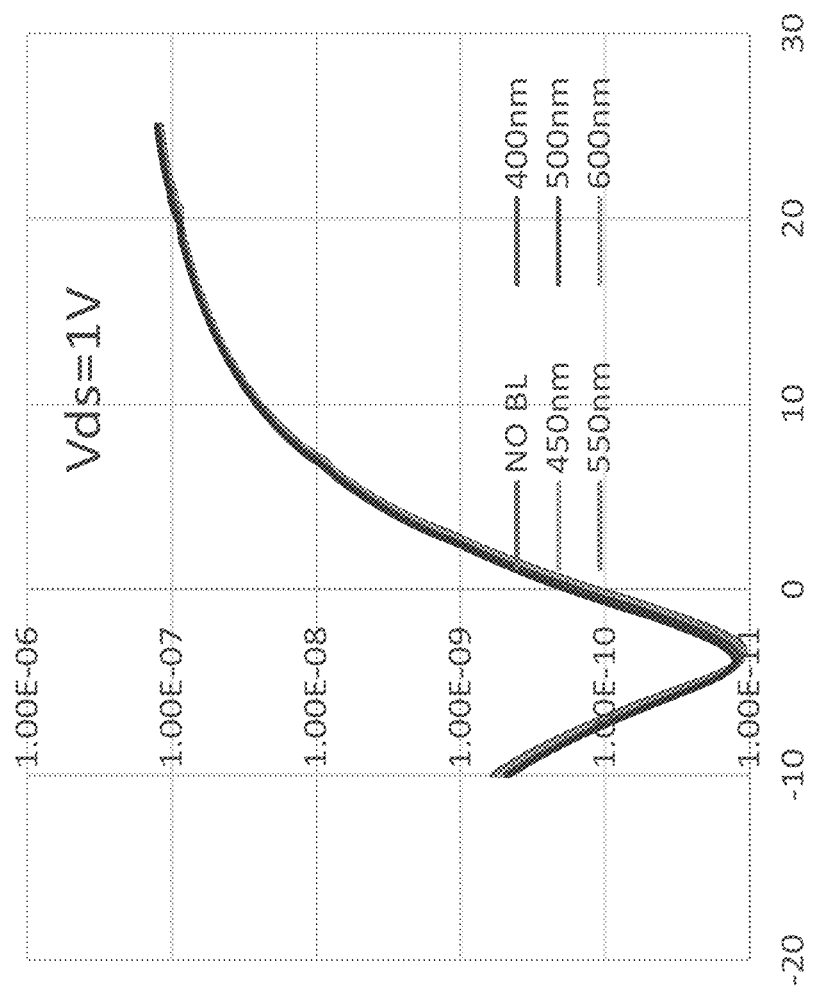

As shown in FIGS. 21a to 21c, in many embodiments methods are capable of producing amorphous silicon like carbon nanotube thin film transistors using amorphous silicon nitride as dielectrics on glass substrates. Moreover, embodiments of carbon nanotube thing film transistors demonstrate stress stability under 10 V gate for 2000 second (10 second per cycle), thermal stability, and photostability (e.g., FIGS. 22a to 22c). Embodiments further demonstrate that carbon nanotube thin film transistors according to processes and methods can be completely produced in currently benchmark display backplane manufacturing lines with cost-saving.

First, studies conducted on carbon nanotube thin films according to embodiments demonstrate that they stick to suitable substrates through hydrophobicity forces. The peel off force is estimated to be at least 4.35 N/cm$^2$. (See, e.g., S. V. Aradhya, et al., *Journal of The Electrochemical Society*, vol. 155, pp. K161-K165, 2008, the disclosure of which is incorporated herein by reference.) Accordingly, carbon nanotube thin films will not peel off from substrates and consequently pollute manufacturing lines, as previously considered a potential problem.

Figure 23:
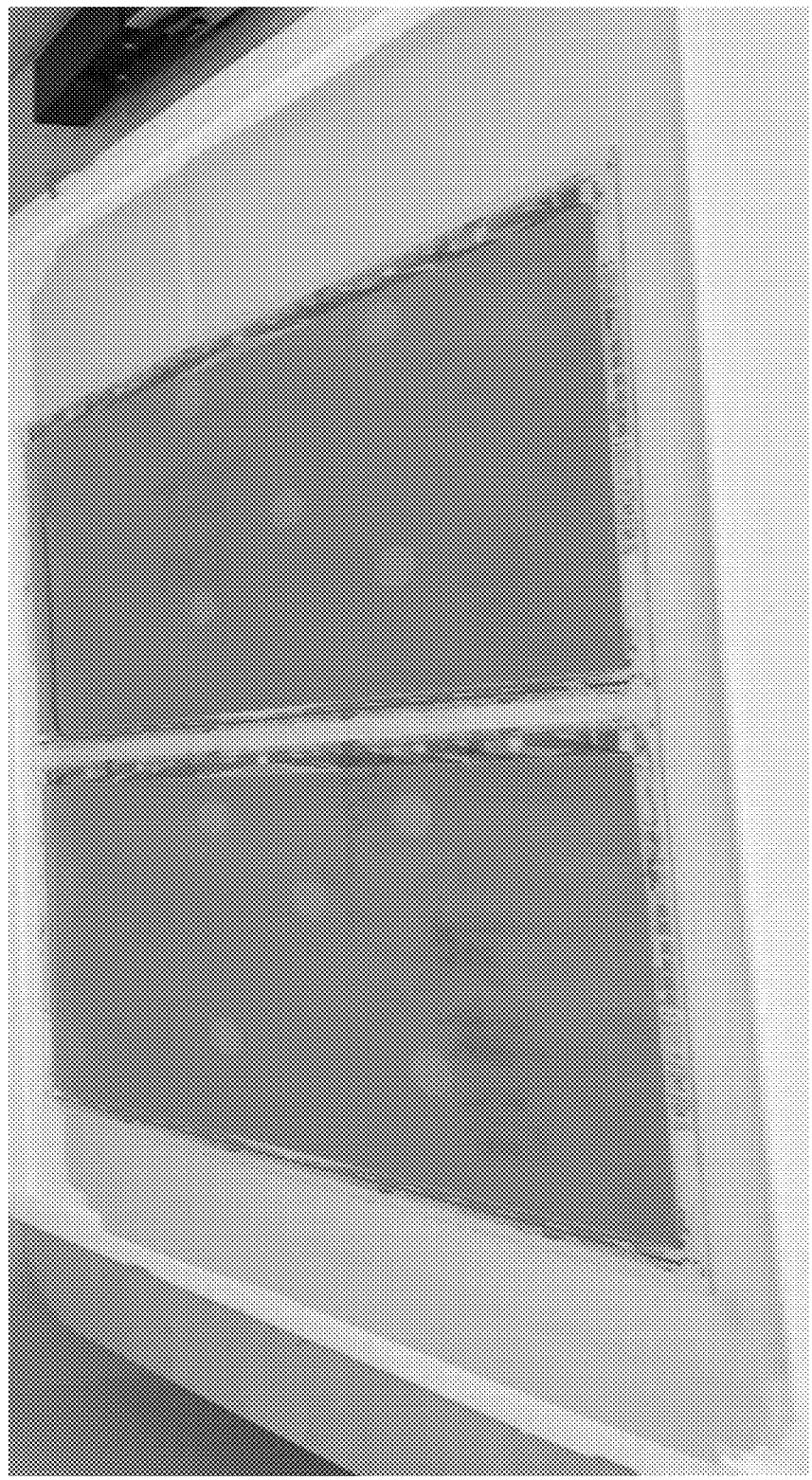
FIG. 23 provides a photographic image of Gen 4.5 glass coated with carbon nanotubes using a solution process according to embodiments.

In order to demonstrate the ability of embodiments of solution processes with aqueous carbon nanotube ink to operate on an industrial scale, a carbon nanotube solution was deposited on 20 pieces of Gen 4.5 glass substrate at ambient environment (see, e.g., FIG. 23). Accordingly, these studies demonstrate that embodiments can be expanded to large size glass substrates such as Gen 10.5 glasses. Importantly, this is the first demonstration of a real solution process for thin film transistors. Therefore, embodiments make it possible to save display manufacturers tremendous costs in high temperature and high vacuum evaporation of semiconducting materials such as silicon, metal oxides. This solution process can be further explored in printing systems, as previously described.

Figure 24:
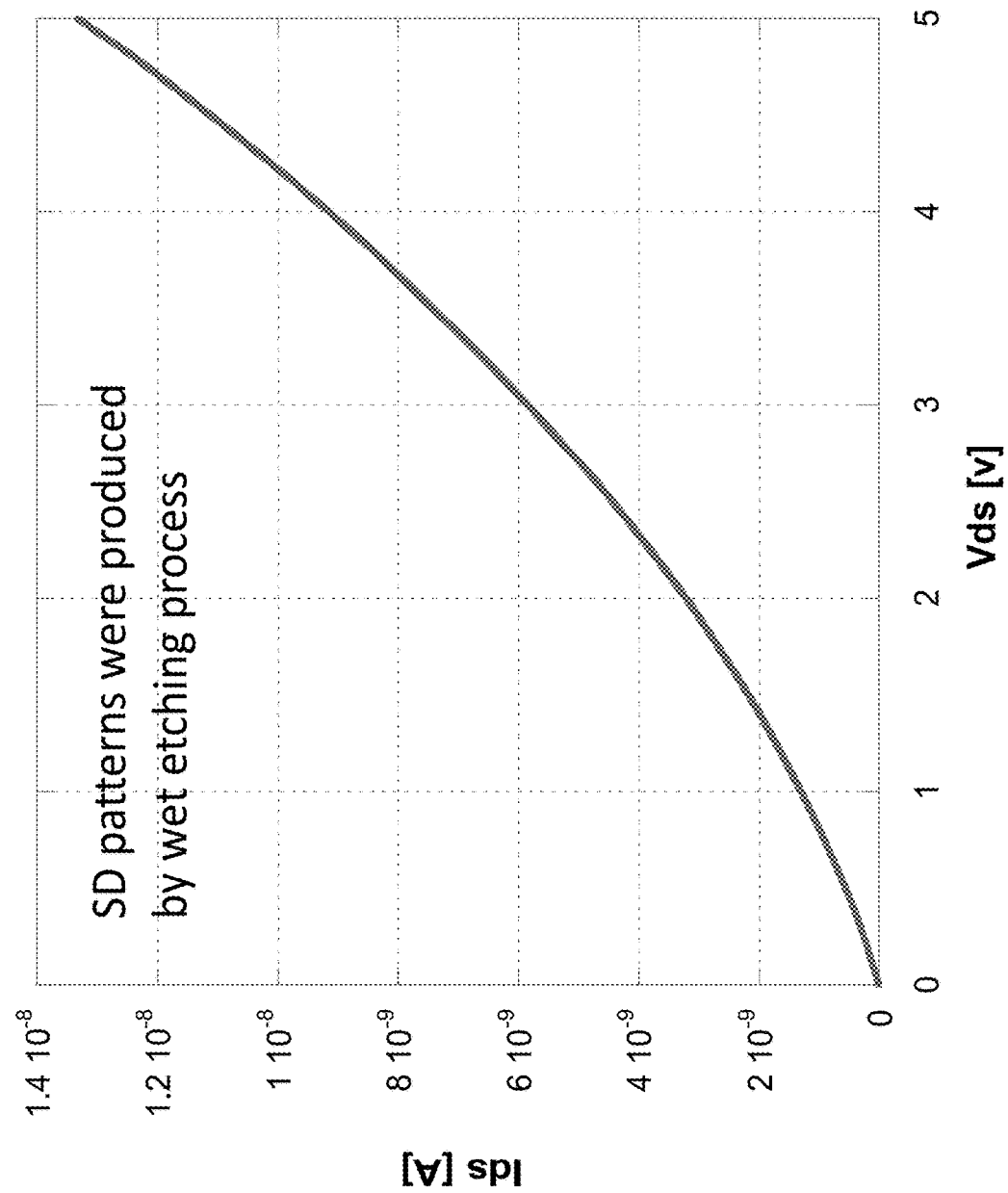
FIG. 24 provides an I-V curve of Al electrodes on carbon nanotube thin films after wet etch using acids according to embodiments.

Different from small scale lift-off photolithography, display manufacturers commonly utilize acids to wet etch metals for electrode patterning. The conventional view is that utilizing such etch methods may result in the removal of carbon nanotubes by acid etching. To demonstrate the robust nature of current embodiments of systems and methods for manufacturing using amorphous silicon thin film transistors Alumina was evaporated on carbon nanotube thin films. After photoresist coating and developing, the substrate was immersed in 55% $H_3PO_4$, 15% $HNO_3$, 5% Acetic Acid and water. The patterned Al electrodes were probed on Keithley 4200 semiconductor characterization system to show perfect connection (as shown in FIG. 24). This result is consistent with wet-etching copper covered carbon nanotubes using a commercial copper etchant ferric chloride. (See, e.g., A. Chortos, et al., *Advanced Materials*, vol. 28, pp. 4441-4448, 2016, the disclosure of which is incorporated herein by reference.) These results strongly demonstrated that metal etchants including acids have negligible effects on carbon nanotube thin films.

Figure 25:
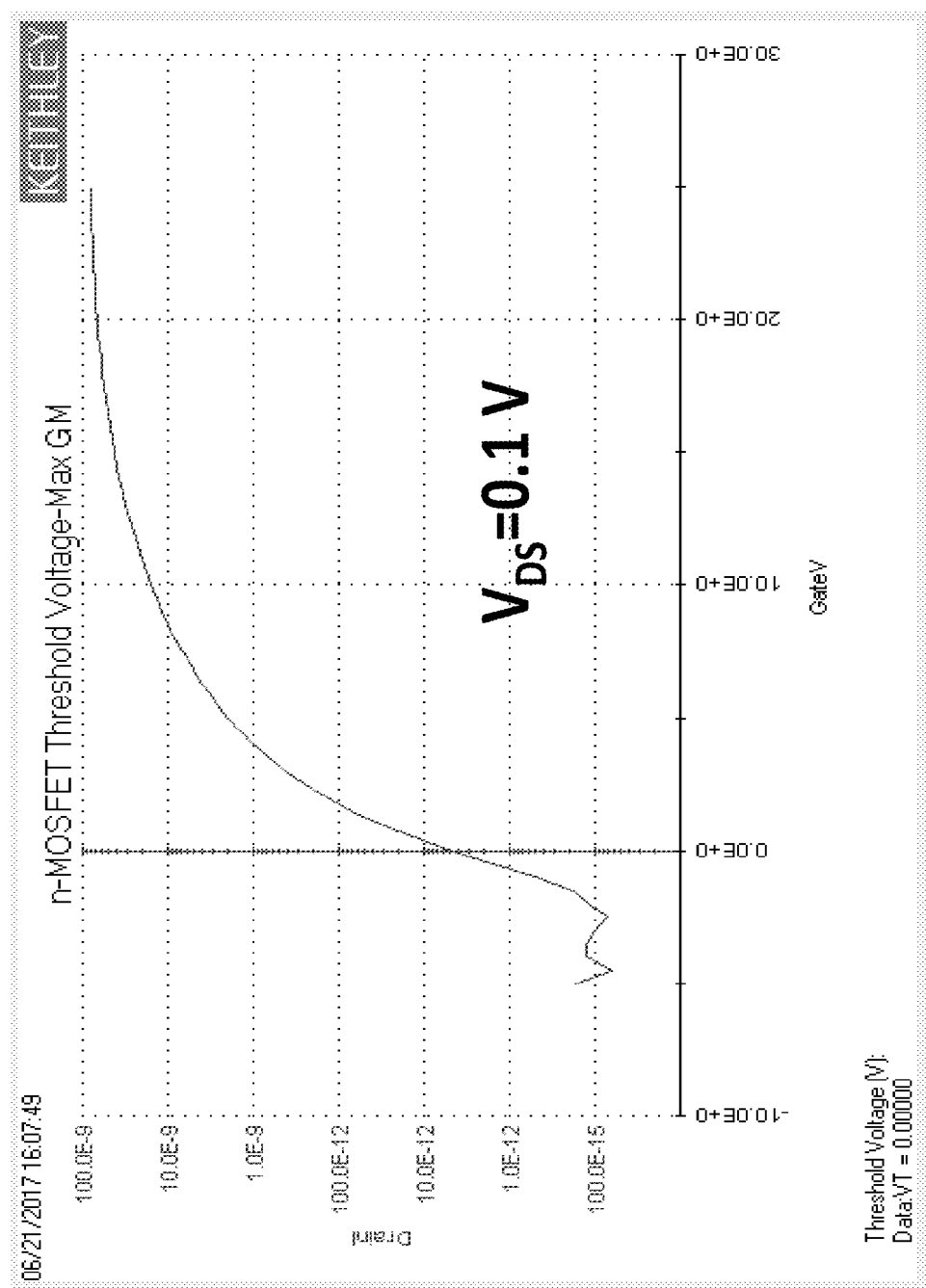
FIG. 25 provides data graphs illustrating transfer characteristics of carbon nanotube thin film transistors with SiNx deposited using STS PECVD according to embodiments.

Embodiments also demonstrate the importance of the PECVD growth conditions for the dielectric materials (e.g., $SiN_x$) to ensure the performance of the amorphous silicon like carbon nanotube thin film transistors described herein. In such embodiments $SiN_x$ plays two roles: a first role is to be a dielectric for charge carrier modulation in semiconducting carbon nanotube thin films; and second role is to dope carbon nanotube thin films to form n-type semiconductor. This doping process could also effect the contacts between metal electrode and carbon nanotube thin films. With different PECVD systems, it shown to be necessary to adjust the feed gas, temperature, pressure and stress conditions. Examples are provided in Table 1, below. In a first example, a Unaxis 790 PECVD was used for $SiN_x$ growth and it was found that the best deposition parameters require a flow rate of ammonium to silane in the ratio of 10 sccm/5.3 sccm. (See, e.g., H. Li, et al., *ACS Applied Materials & Interfaces*, vol. 8, pp. 20527-20533, 2016; and H. Li, *ECS Journal of Solid State Science and Technology* vol. 5, pp. M93-M98, 2016, the disclosures of which are incorporated herein by reference.) Using the same flow rate of $NH_3$ to $SiH_4$ with STS PECVD, no current was detected, indicating damage of the carbon nanotube thin films. However, with an STS PECVD recipe, the fabricated carbon nanotube thin film transistors showing the similar characteristics as presented in FIG. 25.

TABLE 1

| | | | Deposition Parameters | | | |
|---|---|---|---|---|---|---|
| $N_2$ (sccm) | He (sccm) | $NH_3$ (sccm) | $SiH_4LF$ (sccm) | Pwr (W) | P (mTorr) | T (° C.) |
| | | | Unaxis 790 PECVD | | | |
| 100 | 400 | 10 | 5.3 | 40 | 900 | 225 |
| | | | STS PECVD | | | |
| 1960 | 0 | 40 | 43 | 80 | 500 | 250-280 |

These combination of results demonstrate that embodiments may be used by display manufacturers to produce carbon nanotube thin film transistors using current bench mark thin film transistor backplane manufacturing lines. These results can be an important impetus for using carbon nanotube thin film transistors to replace amorphous silicon for display industrial, especially for emerging flexible and wearable displays.

Doctrine of Equivalents

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for manufacturing a single-walled carbon nanotube thin film transistor backplane comprising:
   providing a substrate having at least a size of Gen 4.5;
   patterning a gate electrode and dielectric layer on the substrate to form a channel forming structure;
   depositing a solution of a thin-film layer of single-walled carbon nanotubes on said dielectric layer to form a back-layer; and
   patterning at least a n+ layer, and a drain and a source electrode on the back-layer using a photomask and photolithography process such that the portion of the back-layer overlapping the channel forming structure is exposed.

2. The method of claim 1, wherein the back-layer is deposited by a spraying technique selected from the group consisting of aerosol spray, air spray and ultrasonic spray.

3. The method of claim 2, wherein the single-walled carbon nanotube aerosol is formed from an aqueous solution of single-walled carbon nanotubes that are ultrasonicated in an ultrasonicating nozzle and emitted in a carrier gas flow.

4. The method of claim 1, wherein the back-layer is printed atop the substrate using aerosol jet printing as a single-walled carbon nanotube aerosol.

5. The method of claim 4, wherein the single-walled carbon nanotube aerosol is formed by a technique selected from ultrasonic atomization and pneumatic atomization.

6. The method of claim 1, wherein the single-walled carbon nanotubes adhere onto the dielectric through hydrophobicity forces with a peel off force of at least 4.35 N/cm$^2$.

7. The method of claim 1, wherein the single-walled carbon nanotubes are high purity single chirality single-walled carbon nanotubes.

8. The method of claim 7, wherein the single-walled carbon nanotubes have an index selected from (6,4), (9,1), (8,3), (6,5), (7,3), (7,5), (10,2), (8,4), (7,6), (9,2), and mixtures thereof.

9. The method of claim 1, wherein the single-walled carbon nanotube thin film is formed of a plurality of discrete thin films.

10. The method of claim 1, further comprising depositing and patterning an etch stop layer atop the back-layer such that the etch stop overlaps the channel forming structure.

11. The method of claim 1, wherein further comprising treating the single-walled carbon nanotube thin film with an acidic etch.

12. The method of claim 11, wherein the acidic etch is selected from a group consisting of 5% $H_3PO_4$, 15% $HNO_3$, and 5% Acetic Acid.

13. The method of claim 1, further comprising washing the treated single-walled carbon nanotube thin film.

14. The method of claim 1, further comprising heating the single-walled carbon nanotube thin film during the depositing step at a temperature of from 60 to 200° C.

15. The method of claim 1, wherein the thin films are formed with subthreshold leakage current comprising:
   spin coating a photoresist on the single-walled carbon nanotube thin film;
   defining a pattern atop the photoresist by photolithography to create regions of a defined photoresist and undefined photoresist;
   solution developing the defined pattern to form a developed photoresist; and
   plasma or wet etching the single-walled carbon nanotubes thin film using the developed photoresist to form a patterned single-walled carbon nanotube thin film.

16. The method of claim 1, wherein the patterning comprises a chemical vapor deposition technique.

17. The method of claim 16, wherein the patterning includes the use of a $SiN_x$ material.

18. The method of claim 16, wherein the chemical vapor deposition technique comprises one of either a Unaxis 790 or STS device.

19. The method of claim 18, wherein the chemical vapor deposition technique uses a Unaxis 790 device with a ratio of ammonium to silane of 10 to 5.3 sccm.

20. The method of claim 18, wherein the chemical vapor deposition technique uses an STS device with a ratio of ammonium to silane of around 1 to 1 sccm.

\* \* \* \* \*